(12) United States Patent
Shen et al.

(10) Patent No.: US 6,903,376 B2
(45) Date of Patent: Jun. 7, 2005

(54) SELECTIVE PLACEMENT OF QUANTUM WELLS IN FLIPCHIP LIGHT EMITTING DIODES FOR IMPROVED LIGHT EXTRACTION

(75) Inventors: Yu-Chen Shen, San Jose, CA (US); Michael R. Krames, Mountain View, CA (US); Michael J. Ludowise, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 315 days.

(21) Appl. No.: 10/158,360

(22) Filed: May 29, 2002

(65) Prior Publication Data

US 2002/0190260 A1 Dec. 19, 2002

Related U.S. Application Data

(63) Continuation-in-part of application No. 09/469,657, filed on Dec. 22, 1999, now Pat. No. 6,486,499, which is a continuation-in-part of application No. 09/977,144, filed on Oct. 11, 2001.

(51) Int. Cl.[7] .............................................. H01L 29/267
(52) U.S. Cl. .............................. 257/81; 257/81; 257/82
(58) Field of Search .............................. 257/81, 12, 13, 257/14.15, 22, 94, 431; 315/150; 214/24

(56) References Cited

U.S. PATENT DOCUMENTS

| | | | |
|---|---|---|---|
| 3,813,587 A | 5/1974 | Umeda et al. ............... | 317/235 |
| 4,238,707 A | 12/1980 | Malissin et al. ............. | 315/175 |
| 4,329,625 A | 5/1982 | Nishizawa et al. .......... | 315/158 |

(Continued)

FOREIGN PATENT DOCUMENTS

| | | | | |
|---|---|---|---|---|
| DE | 197 56856 A1 | 12/1997 | | |
| DE | 199 21 987 A1 | 11/1999 | ........... | H01L/33/00 |
| EP | 0 550 963 A1 | 7/1993 | | |
| EP | 0 702414 A2 | 3/1996 | | |
| EP | 0 772 249 A2 | 5/1997 | | |
| EP | 0 772 249 A3 | 11/1998 | | |
| EP | 0 921577 A1 | 6/1999 | | |
| EP | 0 926 744 A2 | 6/1999 | ........... | H01L/33/00 |
| EP | 0 926 744 A3 | 5/2000 | ........... | H01L/33/00 |
| EP | 1 020 935 A2 | 7/2000 | ........... | H01L/33/00 |
| EP | 1 030 377 A2 | 8/2000 | | |
| GB | 2 301934 | 12/1996 | | |
| GB | 2 343 994 | 5/2000 | ........... | H01L/33/00 |
| JP | 0 529 1621 | 11/1993 | | |
| JP | 7 235 624 | 9/1995 | | |
| JP | 11 150 297 | 6/1999 | | |
| JP | 11 191 641 | 7/1999 | | |
| JP | 11 274568 | 10/1999 | ........... | H01S/33/00 |

OTHER PUBLICATIONS

Evans et al., "Edge–Emitting Quantum Well Heterostructure Laser Diodes with Auxiliary Native–Oxide Vertical Cavity Confinement," *Applied Physics Letters*, 67(1995) Nov. 20, No. 21, pp. 3168–3170.

(Continued)

*Primary Examiner*—David Nelms
*Assistant Examiner*—Thinh T Nguyen
(74) *Attorney, Agent, or Firm*—Patent Law Group LLP; Rachel V. Leiterman

(57) ABSTRACT

In accordance with embodiments of the invention, a light emitting device includes a light emitting region and a reflective contact separated from the light emitting region by one or more layers. In a first embodiment, the separation between the light emitting region and the reflective contact is between about $0.5\lambda_n$ and about $0.9\lambda_n$, where $\lambda_n$ is the wavelength of radiation emitted from the light emitting region in an area of the device separating the light emitting region and the reflective contact. In a second embodiment, the separation between the light emitting region and the reflective contact is between about $\lambda_n$ and about $1.4\lambda_n$. The light emitting region may be, for example, III-nitride, III-phosphide, or any other suitable material.

36 Claims, 27 Drawing Sheets

U.S. PATENT DOCUMENTS

| | | | | |
|---|---|---|---|---|
| 4,423,478 | A | 12/1983 | Bullock et al. | 363/89 |
| 4,983,884 | A | 1/1991 | Wychulis | 315/151 |
| 5,362,977 | A | 11/1994 | Hunt et al. | 257/98 |
| 5,408,120 | A | 4/1995 | Manabe et al. | 257/431 |
| 5,410,159 | A | 4/1995 | Sugawara et al. | 257/13 |
| 5,461,425 | A | 10/1995 | Fowler et al. | 348/294 |
| 5,557,115 | A | 9/1996 | Shakuda | 257/81 |
| 5,563,422 | A | 10/1996 | Nakamura et al. | 257/13 |
| 5,744,829 | A | 4/1998 | Murasato et al. | 257/94 |
| 5,779,924 | A * | 7/1998 | Krames et al. | 216/24 |
| 5,862,167 | A | 1/1999 | Sassa et al. | 372/45 |
| 5,886,401 | A | 3/1999 | Liu | 257/678 |
| 5,914,501 | A | 6/1999 | Antle et al. | 257/99 |
| 5,959,401 | A | 9/1999 | Asami et al. | 313/503 |
| 5,998,232 | A | 12/1999 | Maruska | 438/46 |
| 6,016,038 | A | 1/2000 | Mueller et al. | 315/291 |
| RE36,747 | E | 6/2000 | Manabe et al. | 257/431 |
| 6,081,540 | A | 6/2000 | Nakatsu | 372/45 |
| 6,091,085 | A | 7/2000 | Lester | 257/98 |
| 6,121,127 | A | 9/2000 | Shibata et al. | 438/604 |
| 6,133,589 | A | 10/2000 | Krames et al. | 257/103 |
| 6,150,774 | A | 11/2000 | Mueller et al. | 315/291 |
| 6,169,294 | B1 | 1/2001 | Biing-Jye et al. | 257/79 |
| 2002/0047131 | A1 * | 4/2002 | Ludowise et al. | 257/103 |

OTHER PUBLICATIONS

Han, H. et al.: "Electroplated Solder Joints for Optoelectronic Applications" Electronic Components & Technology, 1996, pp. 963–966, XP000646645.

"Barrier Layer in the metallisation of Semiconductor Diodes Lasers" Research Disclosure, Kenneth Mason Publications, Hampshire, 1994, No. 360, p. 179, XP000446545, ISSN: 0374–4353.

Krames et al., "High–Power Truncated–Inverted–Pyramid (AlxGa1–x) 0.5In0.5P/GaP Light–Emitting Diodes Exhibiting>50% External Quantum Efficiency", Applied Physics Letter, vol. 75, No. 16, Oct. 18, 1999, pp. 2365–2367.

Roger Maxwell, "LED or Lamp Flasher: Minimum parts counting Designed for 3V battery operation", http:/www.ee.washington.edu/circuit_archive/circuits.

Mensz, P.M. et al.: "$In_xGa_{1-x}N/Al_yGa_{1-y}N$ violet light emitting diodes with reflective p–contacts for high single sided light extraction" Electronics Letters, GB, IEE Stevenage, vol. 33, No. 24, Nov. 20, 1997, pp. 2066–2068, XP000734311, ISSN: 0013–5194.

G. J. Sun and K. H. Chae, "Properties of 2,3–butanedione and 1–phenyl–1,2–propanedione As New Photosensitizers For Visible Light Cured Dental Resin Composites", Polymer, vol. 41, pp. 6205–6212 (2000).

Tan, Q. et al.: "Soldering technology for Optoelectronic Packaging" Electronic Components & Technology, 1996, pp. 26–36, XP000646646.

Sugawara, H. et al, "Emission Properties of InGaAlP, Visible Light–Emitting Diodes Employing a Multiquatum–Well Active Layer", Jpn. J. Appl. Phys., vol. 33 (1994) Pt. 1, No. 10, Oct. 1994, pp. 5784–5787.

Chang, S. J., et al., "AlGainP multiquantum well light–emitting diodes"IEE Proc.–Optoelectron, vol. 144, No. 6, Dec. 1997, pp. 405–409.

Benisty, H., "Impact of Planar Microcavity Effects on Light Extraction–Part I: Basic Concepts and Analytical Trends", IEE Journal of Quantum Electronics, vol. 34, No. 9, Sep. 1998, pp. 1612–1631.

Yu–Chen Shen et al., "Selective Placement of Quantum Wells in FlipChip Light Emitting Diodes for Improved Light Extraction", Patent Application No. 10/158,360, filed May 29, 2002.

* cited by examiner

LED CHIP

SUBMOUNT

SELECTIVE PLACEMENT OF QUANTUM WELLS IN FLIPCHIP LIGHT EMITTING DIODES FOR IMPROVED LIGHT EXTRACTION

CROSS REFERENCE TO RELATED APPLICATION

This application is a continuation-in-part of application Ser. No. 09/469,657, titled "III-Nitride Light-Emitting Device With Increased Light Generating Capability," filed Dec. 22, 1999, now U.S. Pat. No. 6,486,499, and incorporated herein by reference. This application is a continuation-in-part of application Ser. No. 09/977,144, titled "Selective Placement Of Quantum Wells In Flipchip Light Emitting Diodes For Improved Light Extraction," and filed Oct. 11, 2001.

FIELD OF THE INVENTION

The present invention relates to semiconductor light emitting devices, and more particularly to the placement of quantum wells in flip chip light-emitting devices.

BACKGROUND OF THE INVENTION

Light emitting semiconductor devices such as light emitting diodes may be fabricated from several materials systems, including III-phosphide, III-nitride, and II–VI materials. A "III-nitride" material system is any combination of group III and group V elements, with nitrogen being the primary group V element, to form semiconductors used in the fabrication of electronic or optoelectronic devices. This material system includes, but is not limited to, GaN, AlGaN, AlN, GaInN, AlGaInN, InN, GaInAsN, and GaInPN. The III-nitride material system is suitable for the fabrication of light-emitting devices (LEDs) that generate light with photon energies from the ultra-violet to the red spectral wavelength regimes. These LEDs include light-emitting diodes and laser diodes.

A III-nitride LED typically includes epitaxial layers deposited upon a suitable growth substrate to form a p-n junction via growth techniques, e.g. organometallic vapor-phase epitaxy. Though the examples described below have the n-type layers adjacent to the growth substrate and the p-type layers adjacent to the contacts, it is to be understood that the devices may have any arrangement of p-type and n-type layers. There are some unique challenges in the fabrication of III-nitride semiconductor devices. Because inexpensive III-nitride substrates are not commercially available, the epitaxial growth is forced to occur upon non-lattice-matched substrates, e.g. sapphire or SiC. The epitaxy-up orientation of the conventional LED die requires that light be extracted out the top surface, i.e. out through the contact layers. But, the high resistivity of p-type III-nitride contact layers, e.g. GaN, requires that metallization be deposited on the p-type material surface to provide sufficient current spreading. Because such metals absorb light, a very thin p-electrode metallization (e.g., Ni/Au) is typically used to allow light to escape through the top surface. However, even these thin semi-transparent layers absorb a significant amount of light. Assuming a typical thickness of 100 Å of Au and neglecting Ni (which may be oxidized to form transparent $NiO_x$), the amount of light absorbed in this semi-transparent p-electrode is ~25% per pass at λ=500 nm. At high current densities, the metallization thickness may need to be increased to maintain uniform current injection into the active region, and to avoid generating most of the light in the vicinity of the wirebond pad. Increasing the metal thickness increases light absorption and reduces the extraction efficiency of the device. Clearly, this tradeoff should be avoided in the design of III-nitride LEDs for operations at high current densities (>40 A/cm², which is ~50 mA into a ~0.35×0.35 mm² junction area).

In FIG. 1, Nakamura et al, in U.S. Pat. No. 5,563,422, disclosed a typical prior art III-nitride LED employing a sapphire substrate. Undoped and doped III-nitride layers surround an active region. A non-planar device geometry is necessary where contact to both p and n regions occur on the same side (top) of the LED since the substrate is electrically insulating. Also, two wirebond pads are required on the top of the device. The n-side wirebond pad is also an Ohmic electrode for making electrical connection to the III-nitride epi layers. The high resistivity of the p-type III-nitride layers requires current spreading to be provided by a thin semi-transparent (partially absorbing) NiAu Ohmic electrode that is electrically connected to the p-type III-nitride layers. Light extraction efficiency is limited by the amount of surface area covered by this Ohmic electrode and by the bonding pads. The optical losses associated with the Ohmic and bondpad metal layers are accentuated by the light-guiding nature of the III-nitride materials (n~2.4) on the sapphire substrate (n~1.8).

Inoue, et. al., in EP 0 921 577 A1, disclosed a prior art III-nitride LED having an epitaxy-side down or inverted structure where the light escapes predominantly upwards through a superstrate, i.e. the sapphire growth substrate. The device design conserves active junction area and provides for the smallest possible die size. The p electrode is made of Ni and Au, which are quite absorbing to visible light. Since this device lacks a highly reflective p-electrode metallization, it is limited in terms of light extraction efficiency and does not offer a significant improvement over the conventional (epitaxy-side up) device. Also, because the devices are small (<400×400 μm²) and use a small solder connection area to the package, they are limited in their light generating capability. Finally, this device suffers in efficiency from having guided light trapped within the III-nitride epi layers because of the low-refractive-index sapphire superstrate.

Kondoh et. al., in EP 0 926 744 A2, disclosed a prior art inverted III-nitride LED using a sapphire superstrate. The p-type electrode is silver, which is very reflective in visible light and results in a device with higher light extraction efficiency compared to the device disclosed by Inoue et. al. However, Ag adhesion to III-nitride material is poor. Upon annealing, Ag can conglomerate and destroy the integrity of the sheet Ohmic contact behavior and the reflectivity. Since the device is relatively small (<400×400 μm²) and uses a small solder connection area to the package, it is limited in its light generating capability. Finally, this device suffers in efficiency from having guided light trapped within the III-nitride epi layers because of the low-refractive-index sapphire superstrate.

Mensz et. al., in Electronics Letters 33 (24) pp.2066–2068, disclosed a prior art inverted III-nitride LED using a sapphire superstrate. This device employs bi-layer metal p-electrodes, Ni/Al and Ni/Ag, that offer improved reflectivity compared with Ni/Au. However, these devices exhibited high forward voltages of 4.9 to 5.1 V at 20 mA in 350×350 μm² devices. This yields a series resistance of ~100 Ω, which is more than three times higher than that of devices with good Ohmic electrodes. The high series resistance severely limits the power conversion efficiency. Since these devices are small (<400×400 μm²) and not mounted for low thermal resistance, they are limited in their light generating capability. Finally, these devices suffer in efficiency from having guided light trapped within the III-nitride epi layers because of the low-refractive-index sapphire superstrate.

Edmond et.al., in WIPO WO96/09653, disclosed a vertical injection III-nitride LED on a conducting SiC substrate, shown in FIG. 2. A conductive buffer layer is required for Ohmic conduction from the III-nitride layers to the SiC substrate. The growth conditions required for a conductive buffer layer limits the growth conditions available for subsequent layers and thus restricts the quality of the III-nitride active region layers. Also, the conductive buffer layer may introduce optical loss mechanisms that limit light extraction efficiency. Furthermore, the SiC substrate must be doped to provide high electrical conductivity (ρ<0.2 Ω-cm) for low series resistance. Optical absorption resulting from SiC substrate dopants limits the light extraction efficiency of the device. These conditions result in a trade-off between series resistance and light extraction efficiency and serve to limit the electrical-to-optical power conversion efficiency of the LED in FIG. 2.

SUMMARY OF THE INVENTION

In accordance with embodiments of the invention, a light emitting device includes a light emitting region and a reflective contact separated from the light emitting region by one or more layers. In a first embodiment, the separation between the light emitting region and the reflective contact is between about $0.5\lambda_n$ and about $0.9\lambda_n$, where $\lambda_n$ is the wavelength of radiation emitted from the light emitting region divided by the index of refraction of the material. In a second embodiment, the separation between the light emitting region and the reflective contact is between about $\lambda_n$ and about $1.4\lambda_n$. In a third embodiment, the separation between the light emitting region and the reflective contact is between about $1.55\lambda_n$ and about $1.95\lambda_n$.

BRIEF DESCRIPTION OF THE DRAWINGS

FIG. 17a shows a plan view of the structure. FIG. 17b shows the corresponding schematic diagram.

DETAILED DESCRIPTION

One fundamental limiting condition of LED operation is maximum junction temperature. The maximum junction temperature, $T_{jmax}$, is the temperature of the p-n junction region at which breakdown or failure occurs in some part of the LED or its housing. This breakdown often occurs as the glass transition temperature of an encapsulating epoxy or lens is approached, causing loss of transparency and eventual melting of these materials. With such a limit established, $\Delta T_j$, the temperature rise from ambient to $T_{jmax}$, may be expressed as (assuming power conversion efficiency <<100% which is true for present-day III-nitride devices), $$\Delta T_j = T_{jmax} - T_a = I_{max} V_f \theta_{j-a}, \qquad (1)$$

where $T_a$ is the ambient temperature, $I_{max}$ is the maximum operating current, and $V_f$ is the forward voltage at that current, and $\theta_{j-a}$ is the thermal resistance from the p-n junction to ambient. Inserting a simplified expression for $V_f$, and re-writing yields $$I_{max} = \Delta T_j / [\theta_{j-a} (V_0 + I_{max} R_s)], \qquad (2)$$

where $V_0$ is the turn-on voltage (approximately the II-nitride semiconductor bandgap voltage) and $R_s$ is the electrical series resistance of the device. Solving for $I_{max}$ yields $$I_{max} = [\Delta T_j/(R_s \theta_{j-a}) + (\tfrac{1}{2} V_0/R_s)^2]^{1/2} - V_0/R_s \qquad (3)$$

Figure 1:
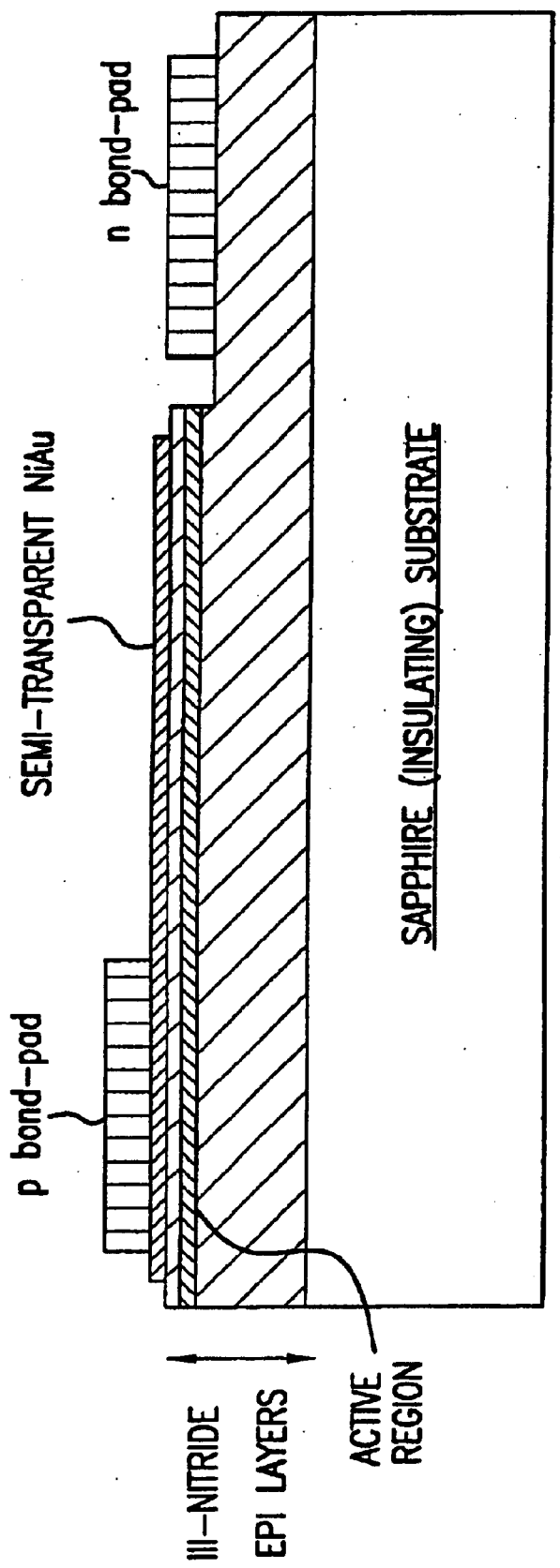
FIG. 1 shows a prior art III-nitride light emitting device with a sapphire substrate.
Figure 2:
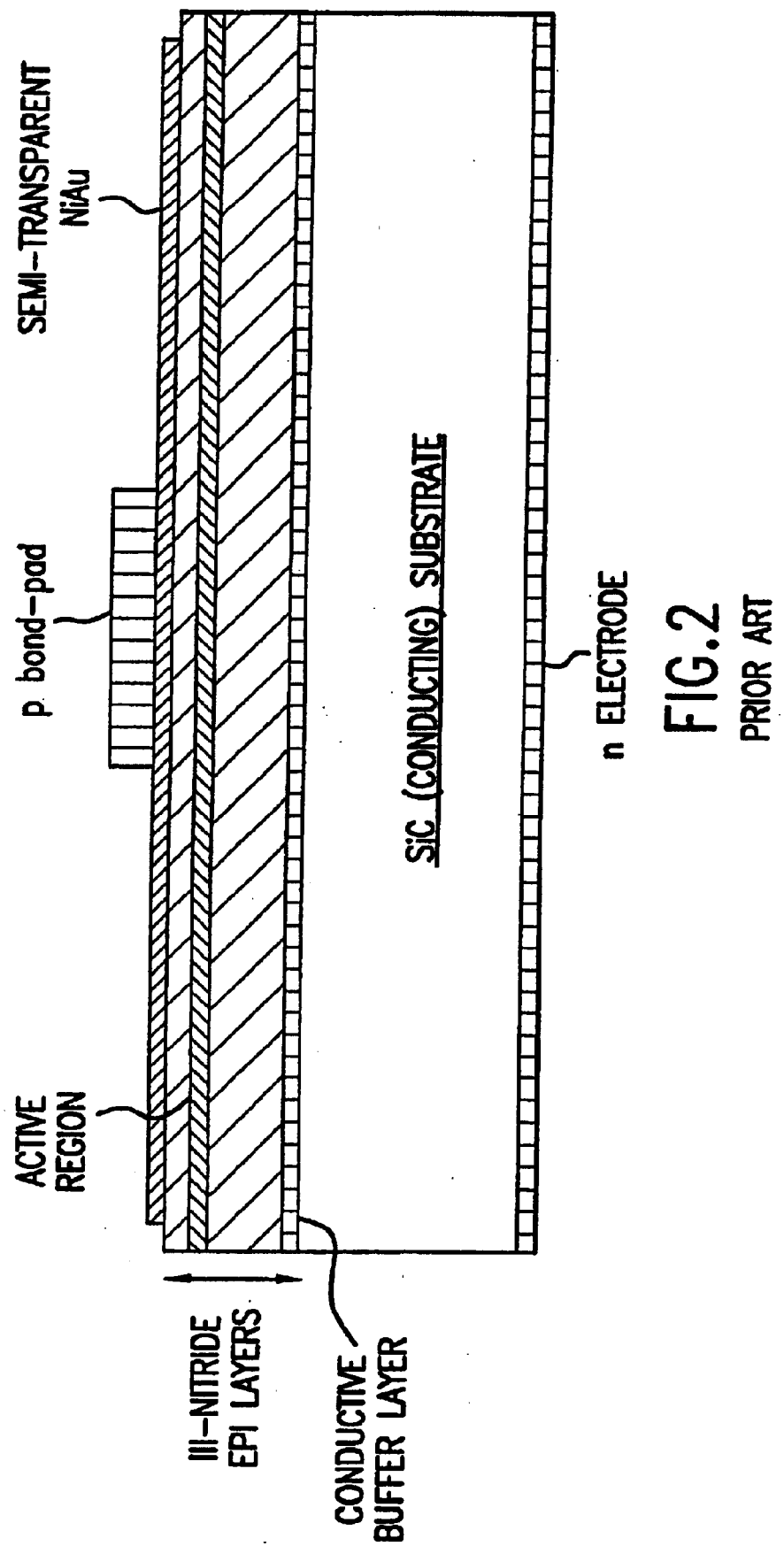
FIG. 2 shows another prior art III-nitride light emitting device a SiC substrate.
Figure 3:
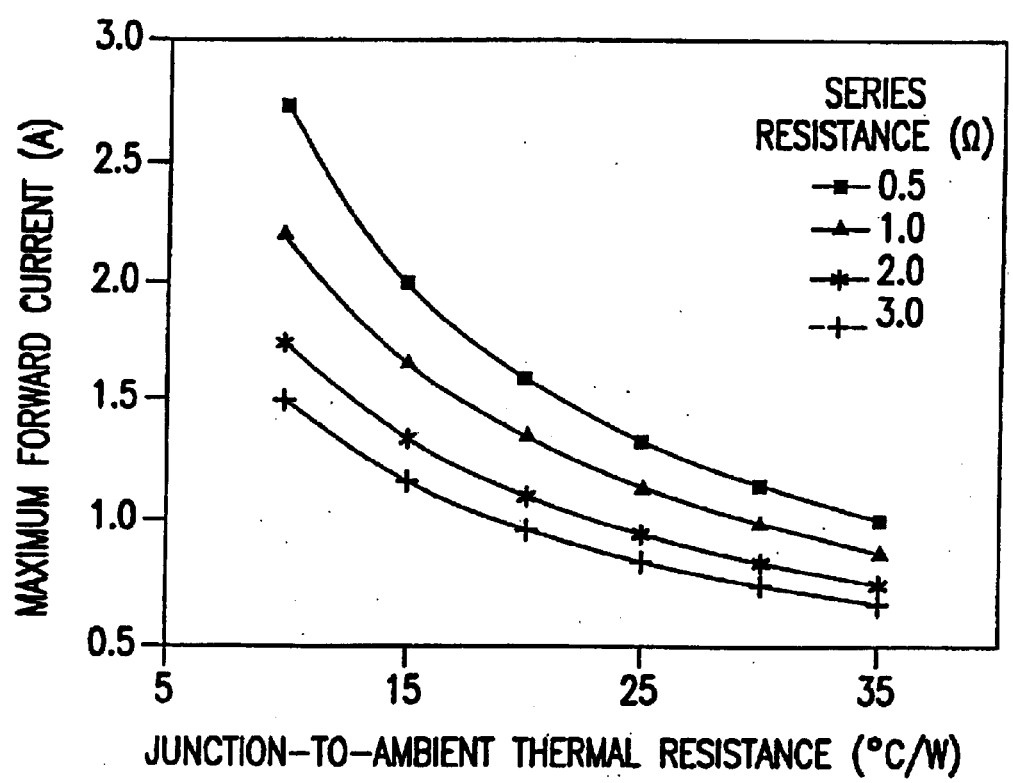
FIG. 3 shows maximum forward current as a function of the junction-to-ambient thermal resistance.

Equation 3 is plotted in FIG. 3 for the case of $V_0$=2.5 V (corresponding to an energy bandgap of wavelength, λ~500 nm) and $T_{jmax}$=130° C. for varying values of $R_s$ and $\theta_{j-a}$. The range of values of these parameters is consistent with die dimensions of ~1 mm² and with systems that are well designed for heat removal. The rank in importance between $R_s$ and $\theta_{j-a}$ is determined by what portion of the graph in FIG. 3 is governing the application. However, in most cases in FIG. 3, a ~5° C./W reduction in thermal resistance more efficiently increases $I_{max}$ (and thus light output) than a ~0.5 Ω drop in series resistance. Because series resistance derives from finite contact resistances and practical doping levels, it is difficult to reduce to arbitrarily low levels. Thus, it is clear that thermal resistance is a significant lever arm for increasing $I_{max}$ and that it must be minimized to maximize light generating capability.

With $I_{max}$ fixed by the limitation on junction temperature, the maximum light generating capability is described in Equation 4:

$$L_{max} = \eta I_{max} \quad (4)$$

where $L_{max}$ is the maximum light output in Watts and $\eta$ is the slope efficiency of the LED in W/A. The slope efficiency is proportional to the external quantum efficiency, such that $$\eta \sim \eta_{ext} = \eta_{int} C_{ext}, \quad (5)$$

where $\eta_{int}$ is the internal quantum efficiency and $C_{ext}$ is the light extraction efficiency of the LED. Thus, with a fixed active region efficiency ($\eta_{int}$), maximum light generating capability is obtained by maximizing extraction efficiency.

Since both series resistance and thermal resistance of the LED die are inversely proportional to junction area, it is desirable to increase the die size to increase $I_{max}$. Scaling up the die geometry arbitrarily runs into practical limitations of primary and secondary optics sizes and power dissipation capability of the LED package within a lighting system. Instead, the die size should be chosen to make efficient use of the allowable power dissipation provided by the LED package. In typical systems, junction-to-ambient thermal resistances are approximately ~60° C./W, as described in Hofler et.al., Electronics Letters 34, 1 (1998). A quick calculation puts an upper limit on the power dissipation of the LED package. Assuming an ambient temperature of 40° C. and a $T_{jmax}$ of 130° C., the maximum input power is (130-40)/60=1.5 W. The maximum input power may be written $$P_{max} = I_{max} V_f = I_f(V_0 + I_{max} R_s) = J_{max} (V_0 + J_{max} \rho_s) A_{die}, \quad (6)$$

where $J_{max}$ is the maximum forward current density in A/cm$^2$, $\rho_s$ is the die series resistivity in Ω-cm$^2$, and $A_{die}$ is the die area (in cm$^2$). For efficient and cost-effective operation, reasonably high forward current densities are required. A suitable forward current density is 50 A/cm$^2$. For 350×350 µm$^2$ devices, a typical series resistance is ~30 Ω, corresponding to a device resistivity on the order of $\rho_s$~4× 10$^{-2}$ Ω cm$^2$. Assuming this same resistivity for Eqn.6, with $J_{max}$=50 A/cm$^2$, and a $V_0$=2.5 V (corresponding to an energy bandgap of wavelength, λ~500 nm), the required die area to achieve the maximum input power allowed by the package is 6.7×10$^{-3}$ cm$^2$, or ~800×800 µm$^2$. Smaller devices at this same power level would result in increasing forward voltages and thus lower efficiency for the same current. Likewise, smaller devices would run at higher temperatures because of increased die thermal resistance.

Because of the high resistivity of p-type III-nitride layers, LED designs employ metallization along the p-type layers to provide p-side current spreading. Therefore, because of the insulating substrate, the n-side current spreading must occur through the n-type III-nitride layers. These layers are typically ~2 µm thick with resistivities of ~10$^{-3}$ Ω-cm. To account for the negligible portion of a typical device resistivity, the distance required for current spreading by the n-type layers should be kept less than ~200 µm. Therefore, a device larger than 400×400 1µm$^2$ requires multiple n-electrode fingers interposing the p-electrode to keep device series resistance low. As shown above, devices for high light generating capability must be large, e.g. >400× 400 µm$^2$. Therefore, these devices should employ an interposing n-electrode design. This design has serious implications for an inverted structure since the n and p electrodes must be kept electrically isolated in connection to a submount.

Figure 4:
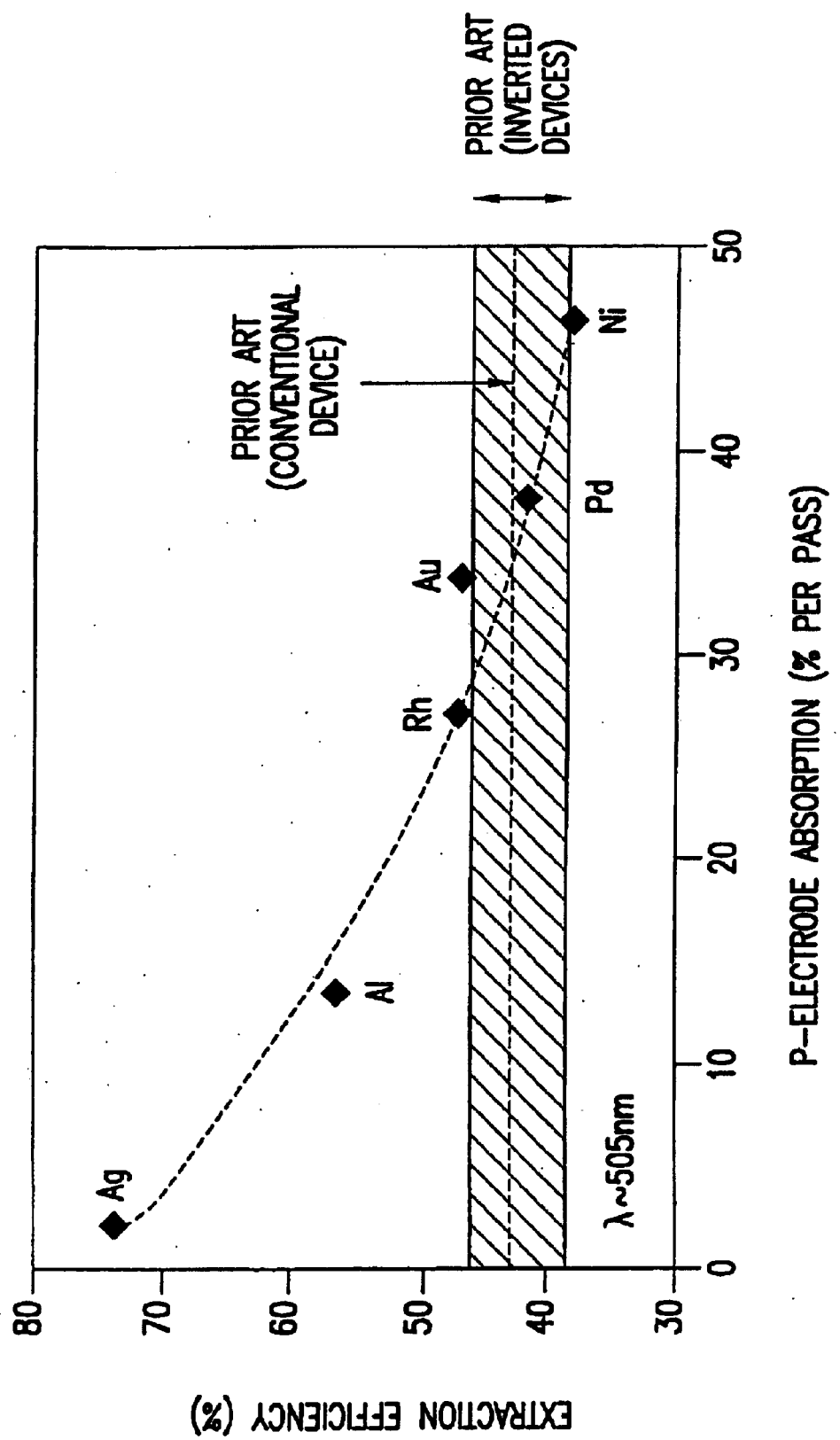
FIG. 4 shows LED extraction efficiency as a function of p-electrode absorption.
Figure 5:
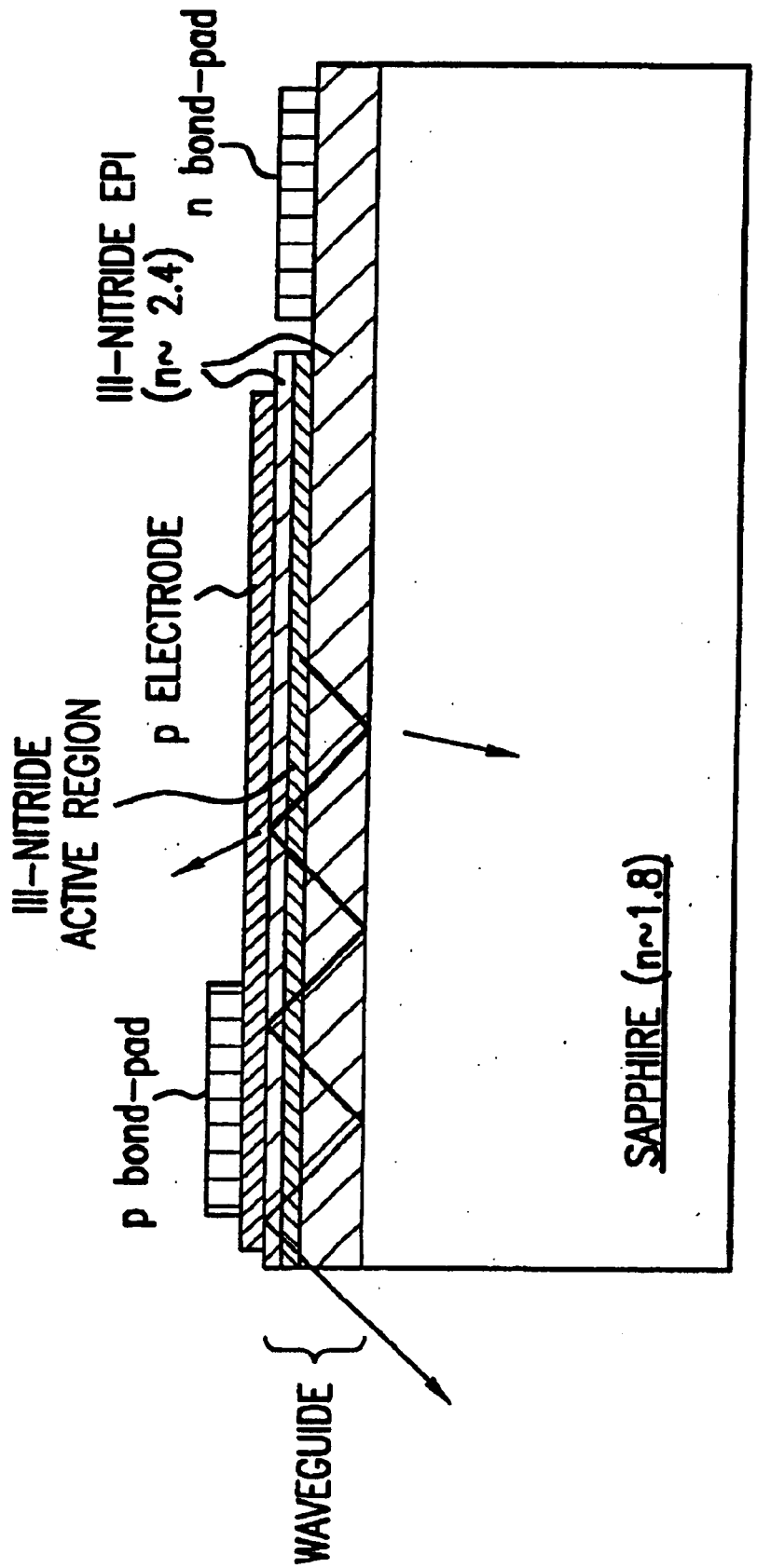
FIG. 5 shows light trapped in a prior art light-emitting device.

For an inverted design, using highly reflective electrode metallizations is critical to improve the extraction efficiency. FIG. 4 shows LED extraction efficiency vs. p-electrode absorption for an inverted die design in comparison with the conventional (epitaxy-side up) device. The extraction efficiencies plotted in FIG. 4 are determined by optical ray-trace modeling of LED die structures (1×1 mm$^2$) and include measured optical properties of all the LED materials. All of the inverted devices that were modeled employ sapphire superstrates, while the conventional devices (not inverted) use sapphire substrates. The p-electrode absorption (x-axis) is defined as the percent of light absorbed per pass assuming illumination from an isotropic point source of light within the III-nitride epi layers adjacent to the p-electrode at the wavelength of interest. The p electrode is the dominant factor for light extraction because it extends almost completely across the active area to provide uniform current injection into the p-n junction. Furthermore, the refractive index difference between the sapphire (n~1.8) and the III-nitride epitaxial layers (n~2.4) results in a large portion of the light generated from the active region being totally-internally-reflected at the sapphire/III-nitride interface. The amount of light trapped in this waveguide is ~cos((1.8/2.4)$^{-1}$)=66% of the total generated light, for isotropic emission from the active region. This light is trapped and guided laterally along the device towards the sides of the die, as illustrated in FIG. 5. While FIG. 5 shows a conventional (epitaxy-up) structure, the waveguiding effect is present whether the die is epitaxy-up or inverted. However, because of absorption by the p-electrode, most of the waveguided light is lost before escaping the device. For this reason, extraction efficiency is very sensitive to p-electrode absorption as shown by the data plotted in FIG. 4. This is especially significant in large-area, e.g. >400×400 µm$^2$, die since the number of passes at the p-electrode before escape is very large. The n electrode is also an optical loss mechanism, but is less significant because it covers less device area.

The ray-trace modeling results shown in FIG. 4 suggest that inverted die designs having Ni and/or Au electrodes provide extraction efficiencies from 38 to 47% (λ=505 nm). Conventional epitaxy-side-up devices with semi-transparent NiAu electrodes have an extraction efficiency of 43%. Hence, a Ni and/or Au p electrode in an inverted device does not provide significantly improved extraction efficiency relative to the conventional design. For an Ag p-electrode, however, the inverted die exhibits a ~1.7× gain in extraction efficiency over the conventional device. As shown explicitly in FIG. 4, to provide increased light extraction beyond a prior art device, the p electrode absorption in an inverted device should be less than 35%. Preferably, the p electrode absorption is less than 25%. While FIG. 4 is plotted for the case of 505 nm, the trend in extraction efficiency vs. p-electrode absorption is true regardless of wavelength. It is also important to point out that, while reflectivity is a prime consideration, so also is contact resistance. Poor contact resistance in the p electrode can result in a device with excessively high series resistance and thus reduced light generation capability as described by Equation 3. For 350× 350 µm$^2$ devices, a typical series resistance is ~30 Ω, corresponding to a device resistivity on the order of 4×10$^{-2}$ Ω cm². The p contact resistivity should be much less than this to minimize its contribution to the series resistance. In the present invention, the p specific contact resistivity is preferably less than $10^{-2}$ Ω cm².

The combination of low optical absorption and low contact resistivity in a manufacturable process are difficult to achieve for III-nitride devices. For example, Ag makes a good p-type Ohmic contact and is very reflective, but suffers from poor adhesion to III-nitride layers and from susceptibility to electro-migration in humid environments which can lead to catastrophic device failure. Al is reasonably reflective but does not make good Ohmic contact to p-type III-nitride materials, while other elemental metals are fairly absorbing (>25% absorption per pass in the visible wavelength regime). A possible solution is to use a multi-layer contact which includes a very thin semi-transparent Ohmic contact in conjunction with a thick reflective layer which acts as a current spreading layer. An optional barrier layer is included between the Ohmic layer and the reflective layer. One example of a p-type multi-layer contact is Au/NiO$_x$/Al. Typical thicknesses for this metallization scheme are 30/100/1500 Å. Similarly, a suitable n-type GaN multi-layer contact is Ti/Al with typical thicknesses of 30/1500 Å.

Since the p-electrode reflectivity is a dominant factor in extraction efficiency, it must not be compromised in designing for manufacturability. Even though on-wafer testing of inverted III-nitride LEDs is made difficult by the opaque sheet metallization, methods for such testing must not require degrading the reflective nature of the p electrode. For example, openings or semi-transparent regions inserted in the p electrode to allow light to escape upward during on-wafer testing only serve to degrade the efficiency of the finished device, by effectively reducing the p electrode reflectivity. Other methods that do not compromise the p-contact reflectivity should be used.

Figure 6A:
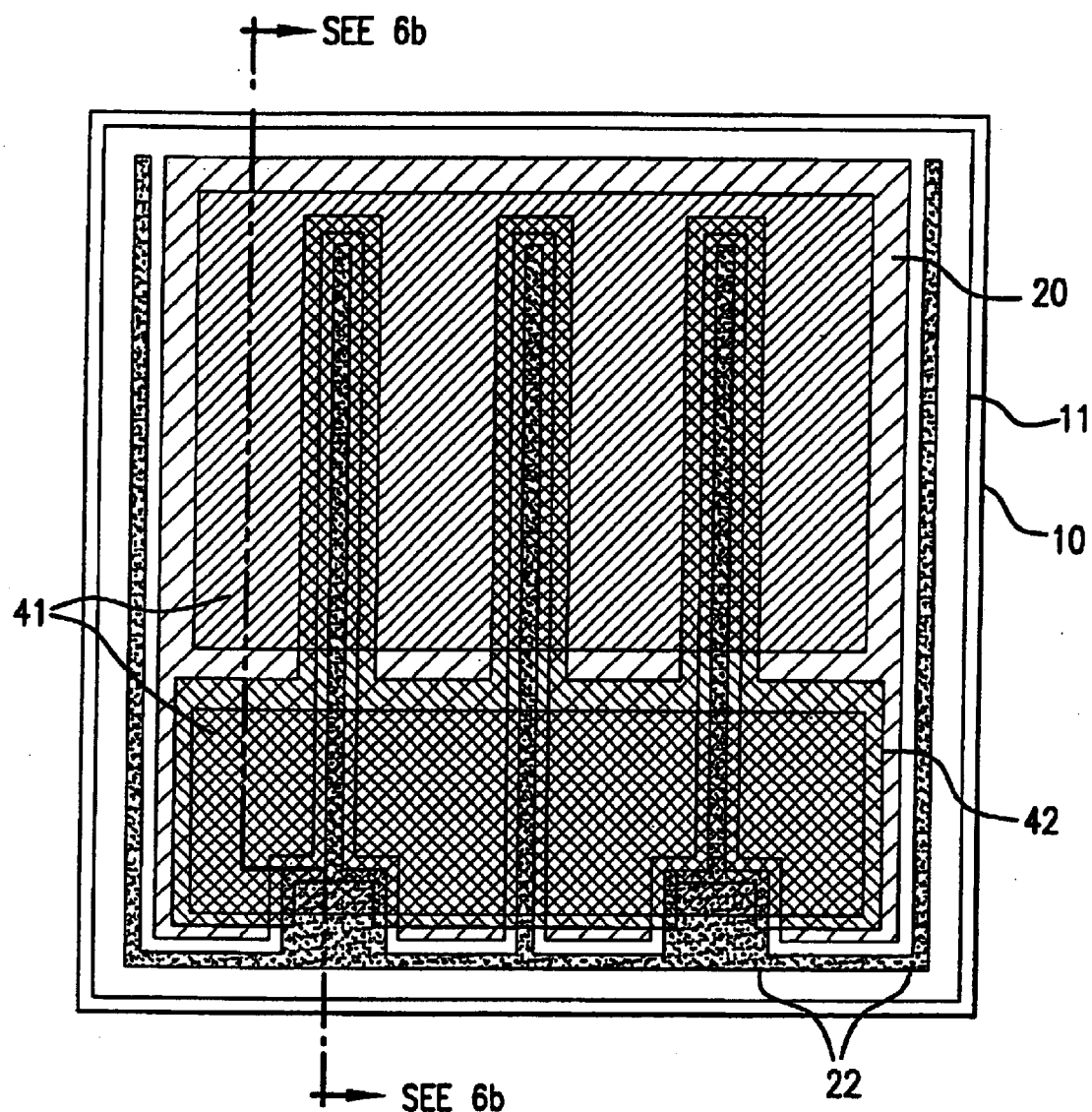
FIGS. 6a–b illustrate the plan and cross-sectional views of an embodiment of the present invention, respectively.

The present invention provides for a large-area, e.g. >400×400 µm², high-power LED with maximum light generating capability by reducing the thermal resistance from the p-n junction to the lamp package while increasing light extraction. To accomplish this, the present invention uses an inverted structure employing a low resistivity, opaque, highly reflective p-electrode. A first embodiment is shown in FIGS. 6a–b.

Figure 6B:
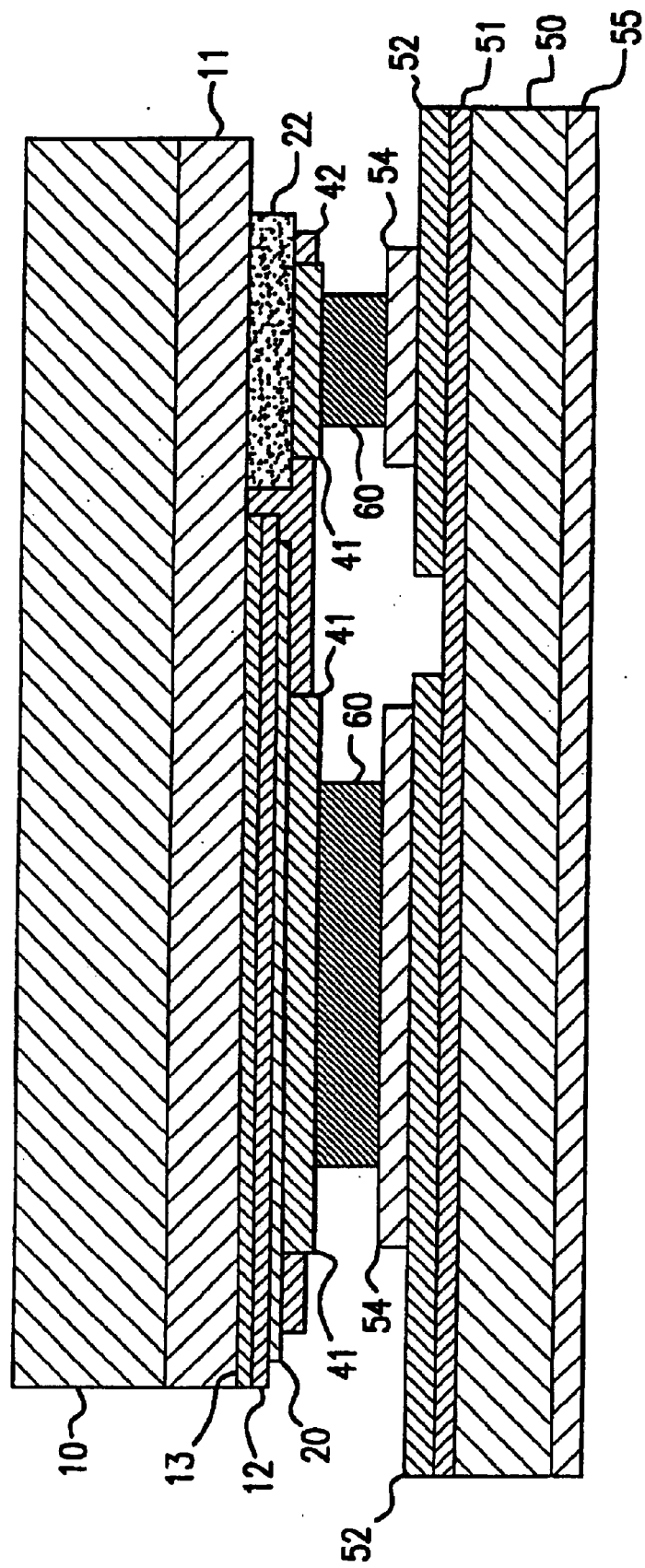

In the cross-sectional view shown in FIG. 6b, the device includes a III-nitride epitaxial heterostructure n-type and undoped layers 11 and p-type layers 12, each in contact with an active region 13. The III-nitride layers 11 are optionally attached to a transparent superstrate 10. The superstrate 10 can be the growth substrate for deposition of the III-nitride layers. In the plan view of the bottom of the LED die shown in FIG. 6a, the large area of the device (>400×400 µm²) requires n-electrode 22 "fingers" interposing the p-electrode metallization 20 to spread current uniformly throughout the device. Such an electrode configuration is required in large-area devices to provide a low series resistance (to overcome the low conductivity III-nitride layers) and thus provide a high maximum drive current as specified in Equation 3. Thus, the interposed n-electrode configuration is required for large-area devices for maximizing total light generation capability. The device is inverted so that light may be taken out through the transparent superstrate 10 as well as the sidewalls and provides good extraction efficiency by using a highly reflective, thick p-electrode metallization 20. The reflectivity of the p-electrode is such that its absorption at the LED emission wavelength is less than 25% per pass, as described above. The electrode metallizations connect to submount electrodes 52 on a submount substrate 50 via interconnects 60. The interconnects make electrical connection between the LED and the submount while providing a thermal path for heat removal from the LED during operation. Although the illustrated embodiments refer to solder, the interconnects may be made of elemental metals, metal alloys, semiconductor-metal alloys, solders, thermally and electrically conductive pastes or compounds (e.g., epoxies), eutectic joints (e.g., Pd—In—Pd) between dissimilar metals between the LED die and submount, Au stud-bumps, or solder bumps.

The interconnects are attached to the LED and submount via conductive interfaces 41, 54. When solder is used as the interconnect, the conductive interfaces are wettable metals. An application process initially determines the interconnect thickness and area. One applicable technique is a screen-printing process where paste is applied to select areas on the submount wafer or LED. Other techniques include electro-plating, lift-off, and reflow. For an embodiment using solder as the interconnect, the final interconnect thickness and area are determined by the solder volume as well as the wettable metals 41 on the LED die and 54 on the submount. The solderable areas on the LED are defined through patterning of the wetting metals, or through vias in a patterned dielectric passivation layer 42 provided on the LED die. The dielectric passivation 42 layer acts as an electrical isolation layer between the p and n electrodes and is required since the solder layers 41 extend across both p and n electrodes. The solderable areas on the submount are similarly defined by patterning the solderable metals 54. In an alternate embodiment, the wettable areas of the metallization 54 may be defined by a patterned dielectric layer. A second set of solderable metal layers 55 may be deposited on the back of the submount for attachment to the package. Optionally, a suitable solder can be deposited directly on the back of the submount. Because the thermal conductivity of any underfill material between the LED and submount is very low, e.g. <2.0 W/mK, the junction-to-package thermal resistance is largely governed by the die/submount solder joint and the submount material and geometry. Assuming heat generation at the p-electrode metallization and one-dimensional flow and ignoring the thermal resistances of thin layers and the submount-package solder joint, the junction-to-package thermal resistance may be written as $$\theta_{j-p} = (t_s/\rho_s + t_{sm}/\rho_{sm})/A_s, \text{ (dielectric ignored)} \quad (7)$$

where $t_s$ and $t_{sm}$ are the thicknesses, and $\rho_s$ and $\rho_{sm}$ are the thermal conductivities, of the solder and submount, respectively, and $A_s$ is the total cross-sectional area of the solder. As shown in Equation 6, the solder area, $A_s$, controls thermal resistance. Hence, it is desirable to cover the entire surface of the LED die with the solder. This is not possible as electrical isolation is required between the p and n electrode regions of the LED. Also, the width of this gap between the n and p solderable metals must account for tolerances in die attaching to the submount. Even so, the embodiment in FIG. 6a provides ~85% solder coverage (defined as the ratio of solderable metal area 41 relative to the p electrode area 20).

An alternate embodiment to that shown in FIGS. 6a–b includes a sheet reflector that comprises a portion of the p electrode 20 and extends beneath portions of the n electrode 22. An intermetal dielectric is formed between these regions of the n-electrode and the sheet reflector. The intermetal dielectric provides electrical isolation between the n and p electrodes in these regions. Other portions of the n electrode are not covered by the dielectric, to allow electrical connection to the submount. This embodiment reduces light leakage downward through gaps in the LED metallization, compared to the embodiment shown in FIGS. 6a–b, by reflecting this light upwards.

Figure 7:
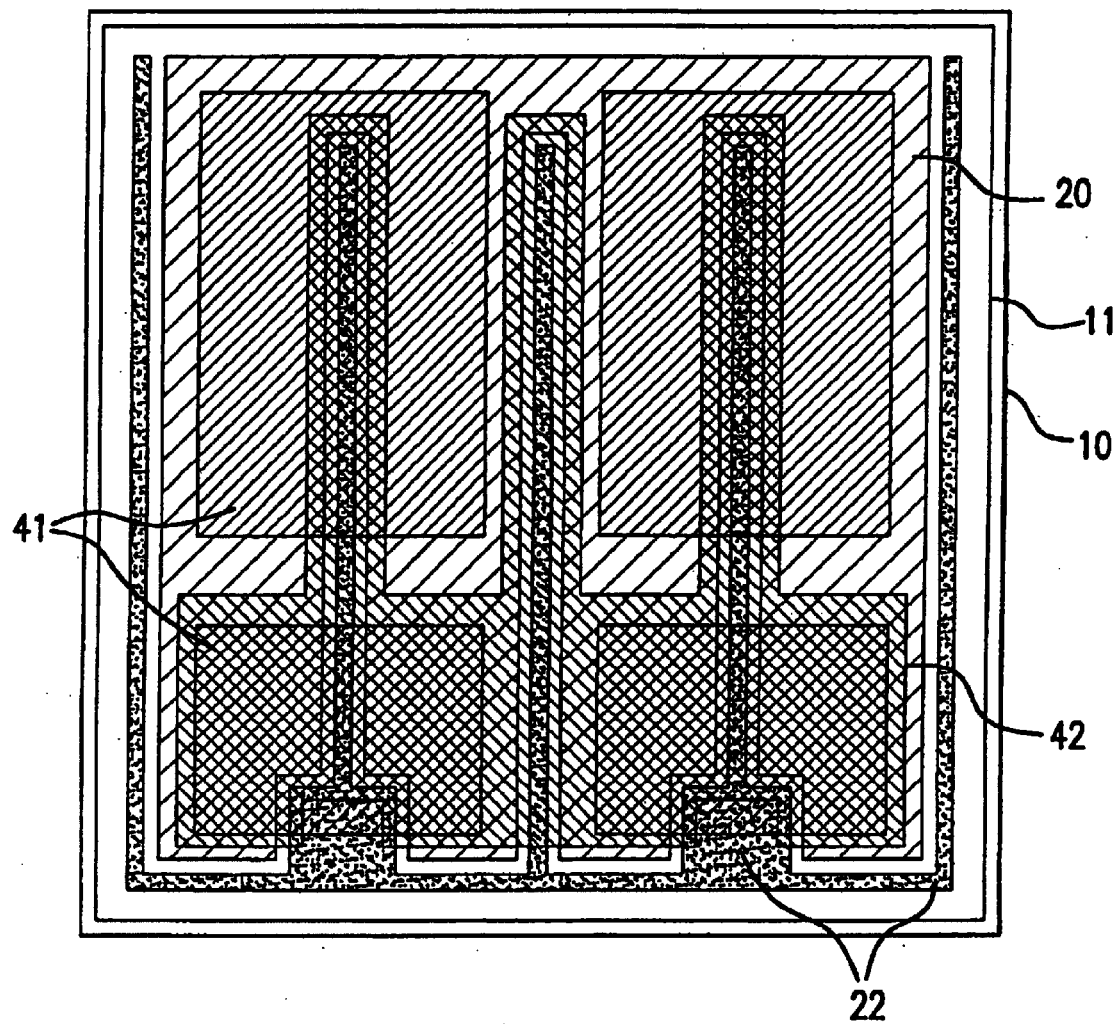
FIG. 7 illustrates an embodiment of the present invention.

The interconnect between the LED and submount is made when the solder is placed in a reflow oven at a temperature above the solid temperature of the solder alloy. During reflow, capillary forces and surface tension tend to align solderable metal areas to the solder sheets. This allows for some self-realignment of the LED die to the submount wafer. This self-realignment can be exploited through the use of a fast die-attach machine, allowing one to trade-off initial die-attach accuracy for speed. Further breaking up each p and n solder sheet into multiple sheets can improve self-realignment. In FIG. 7, the embodiment shows the p and n solder pads 41 in pairs. The gaps between the solder sheets are determined by the accuracy of the die-attach machine. The embodiment of FIG. 7 has superior self-realignment characteristics in the x and y directions while the embodiment of FIG. 6a has predominantly self-realignment characteristics in the y direction.

Figure 8:
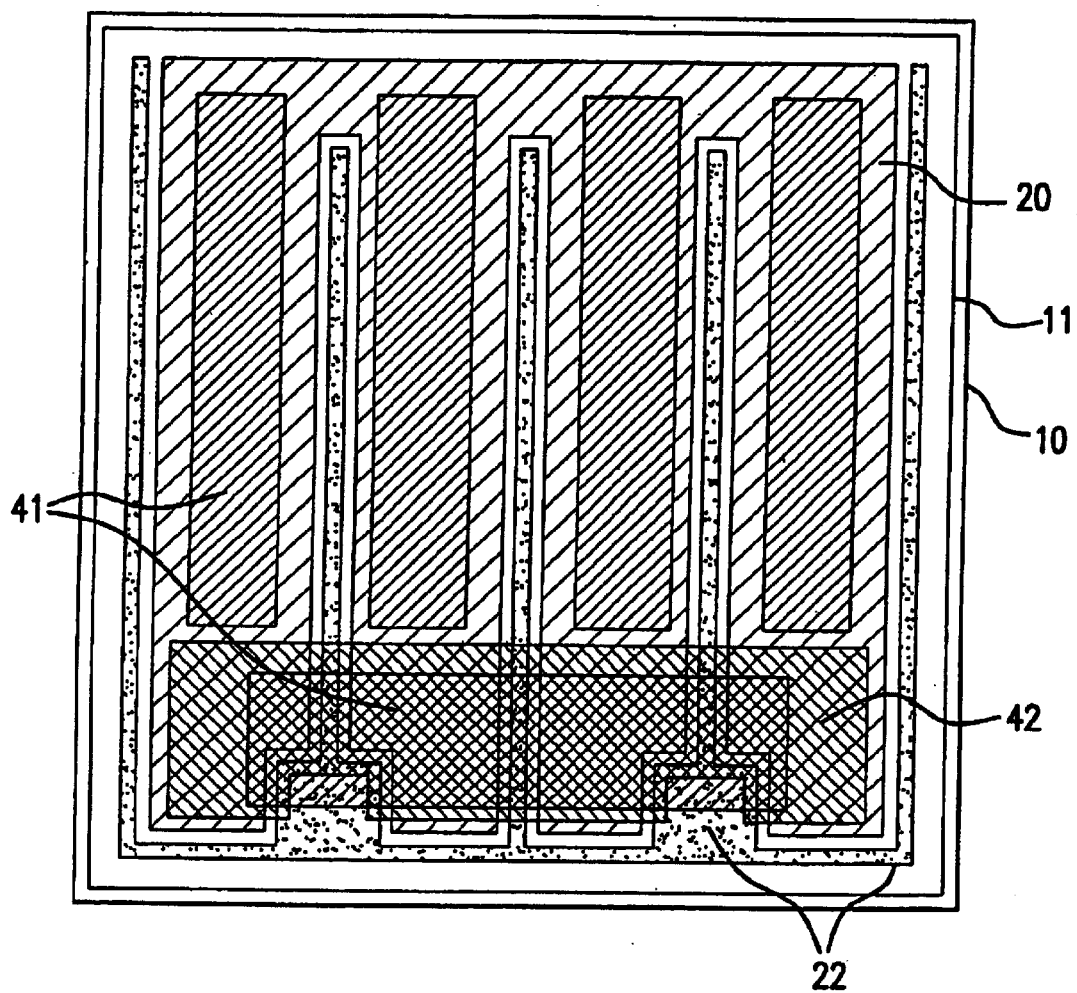
FIG. 8 illustrates an embodiment of the present invention.

In FIG. 8, the alternate embodiment shows the solderable metals 41 as solder "bars" of equal area. This design has the benefit of good self-realignment along with uniform wetting of the solderable metals during reflow. Uniform wetting occurs because the forces applied between the die and submount are proportional to the area of solder wetting. Uniform wetting is achieved by using a wettable metal pattern that consists of regions of equal area. Uniform wetting prevents the LED die from tilting during reflow and the subsequent cool-down. Maintaining a planar LED attach process means the LED die is less likely to undergo failure mechanisms, e.g. shorting of the p-n junction, which may emerge in the case where portions of the LED die are in close proximity to metallized areas on the submount. Also, the non-tilted LED die orientation provides improved light coupling to the other optical components in the LED lamp or system.

Figure 9:
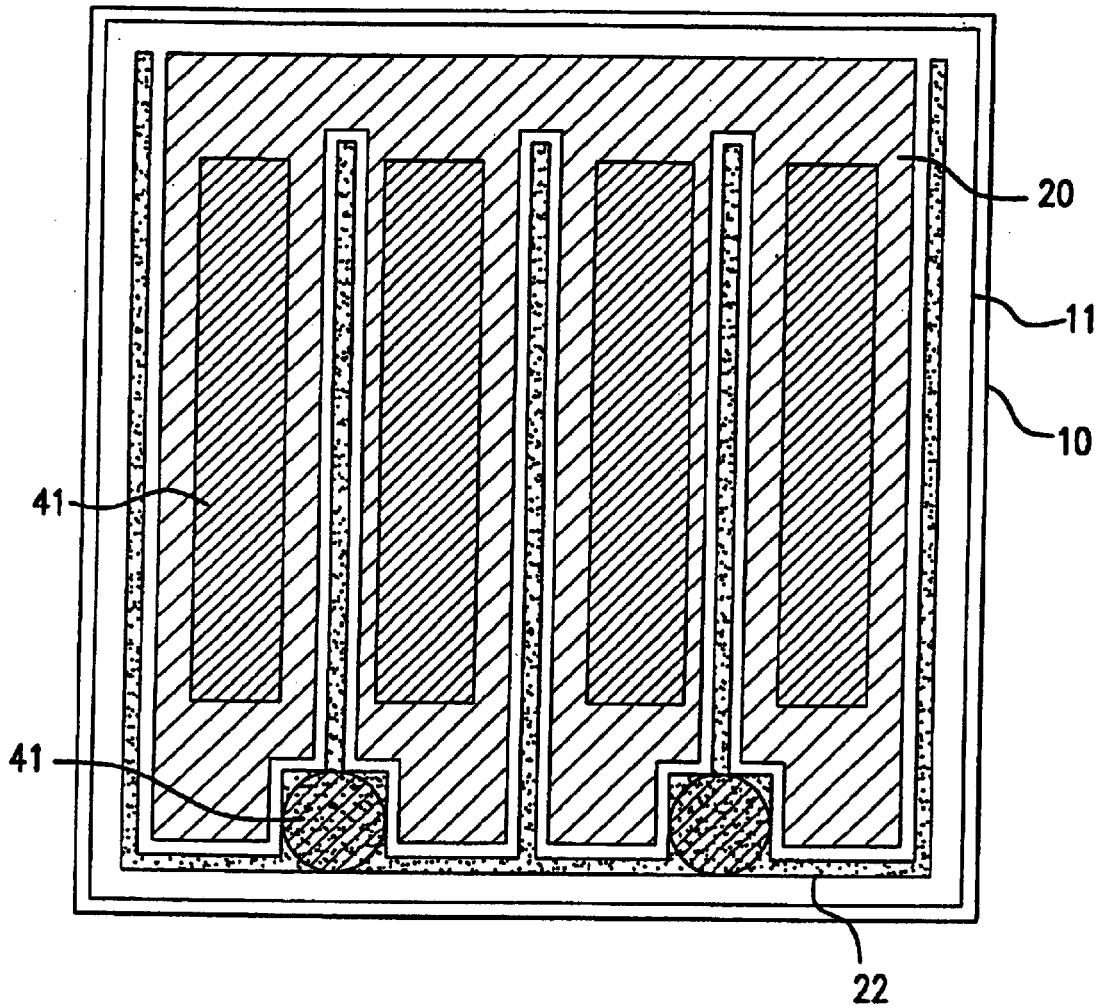
FIG. 9 illustrates an embodiment of the present invention.

In FIG. 9, another embodiment shows the n region solderable metal changed to pads for solder "bumps". The wafer fabrication process is simplified since isolation between the n and p electrodes are no longer required in the vicinity of the n solder pads hence eliminating the need for the dielectric passivation layer 42. The solder bump fabrication is an industry-standard practice, allowing solder connections at the n electrodes to be provided through well-established manufacturing techniques.

Figure 10A:
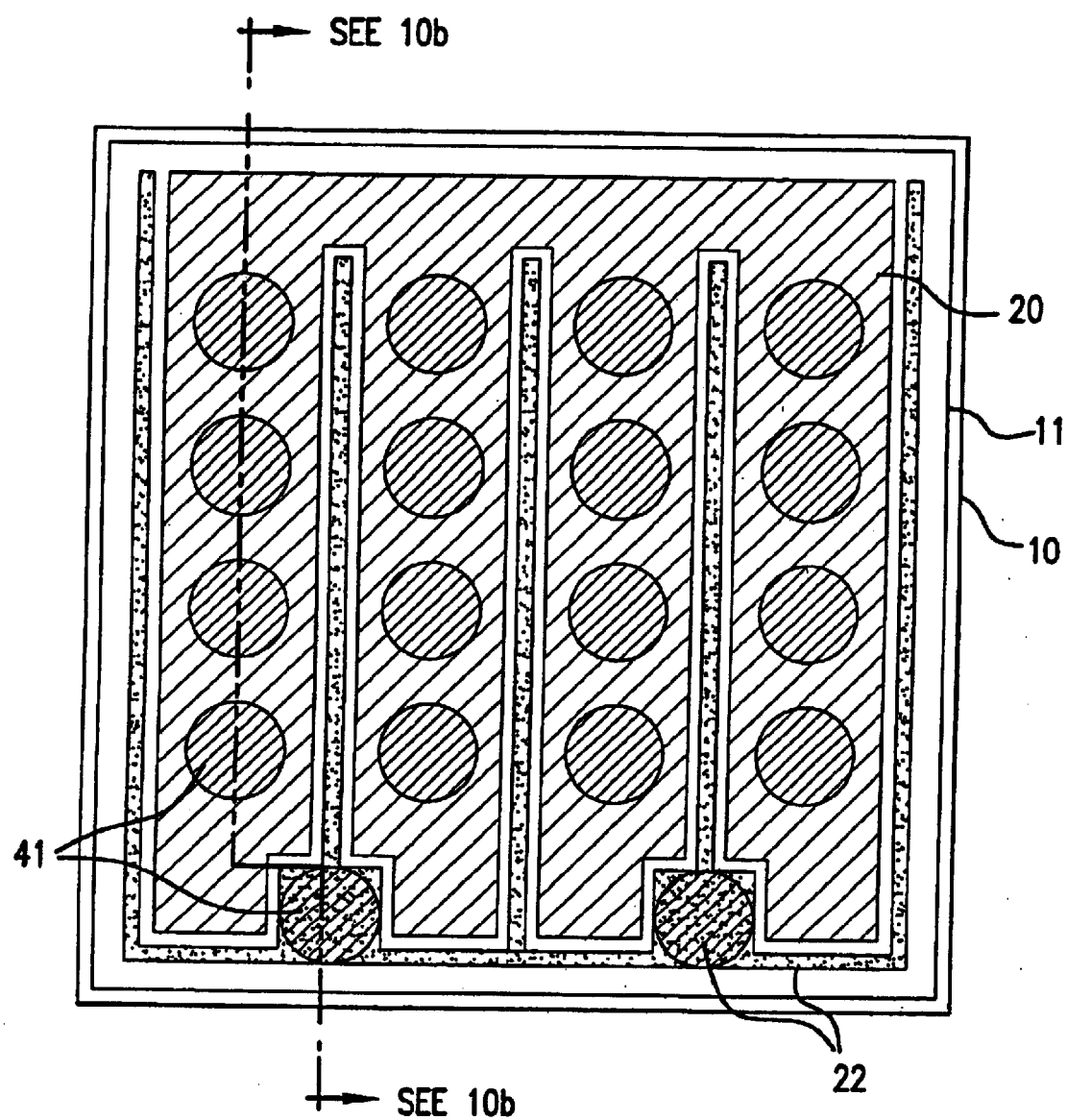
FIGS. 10a–b illustrate the plan and cross-sectional views of an embodiment of the present invention, respectively.
Figure 10B:
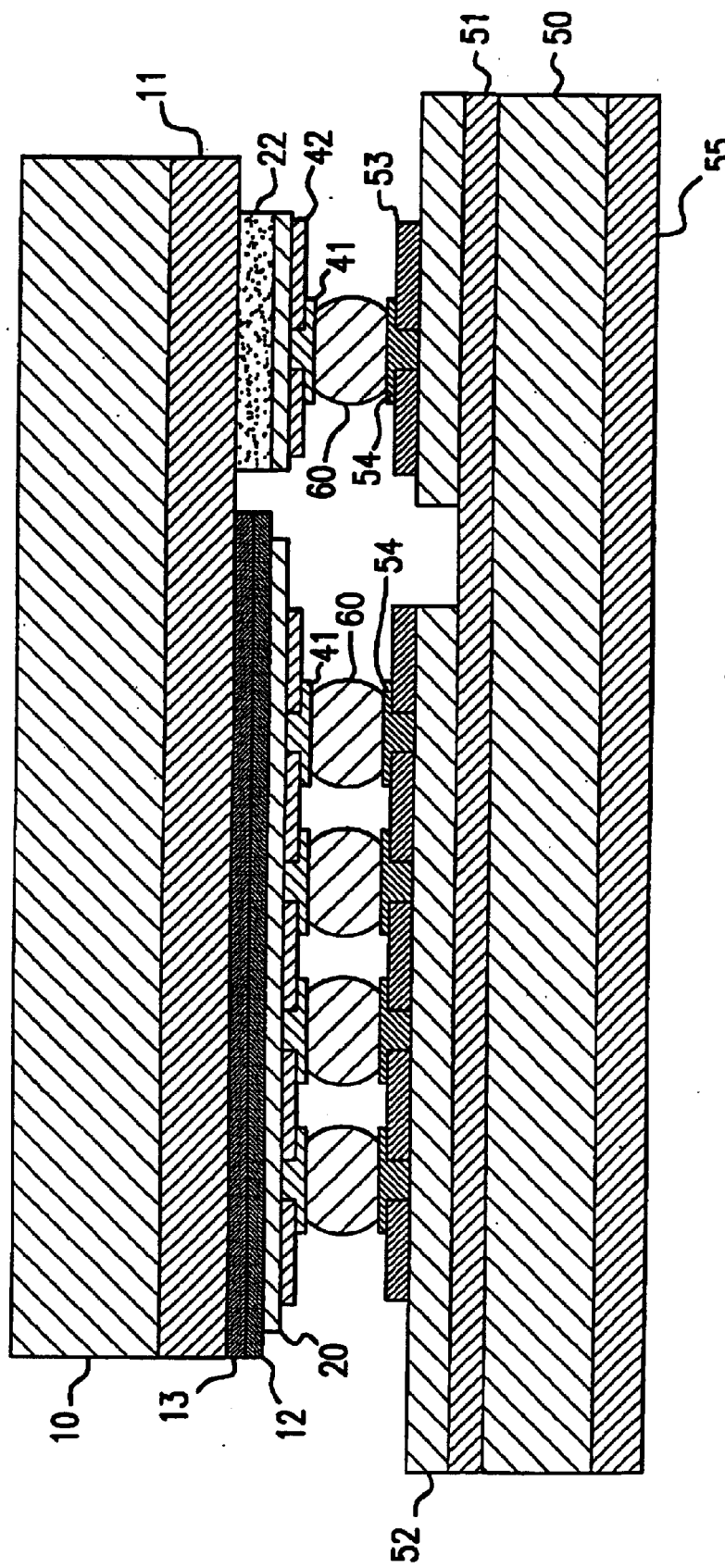
Figure 11A:
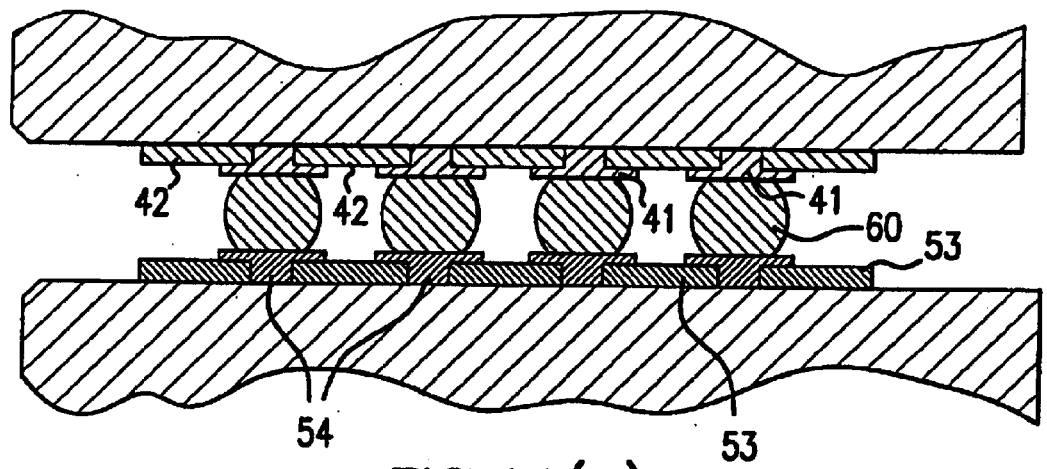
FIGS. 11a–b illustrate cross-sectional views of the embodiment shown in FIGS. 10a–b.
Figure 11B:
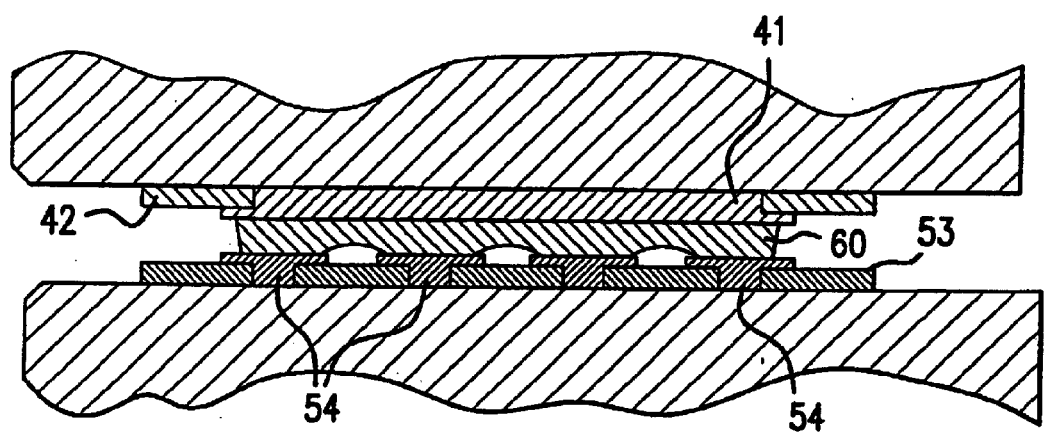

In an alternate embodiment, the plan and cross-sectional views shown in FIGS. 10a and 10b respectively, the entire solder attach interface is provided by solder pads for bumps. To minimize thermal resistance, the number of bumps is maximized to increase the final cross-sectional solder joint area, while minimizing the final solder thickness. The number of bumps is dictated by the state-of-the-art in solder bump formation which puts limits on solder-bump pitch for a given bump diameter. A typical pitch is 200 $\mu$m for 100 $\mu$m diameter bumps. For a 1 mm² die, five rows of 100 $\mu$m diameter bumps are feasible. In FIG. 10a, one row is two bumps for the n pads. The n-electrode fingers limit the number of bump rows along the p-electrode metallization to four. In this design, the solder area cross-section is maintained to be at least 15% of the area of the p-electrode. The solder area coverage may be increased by expanding the wettable metal surface area beyond the small vias required for individual bumps. For example, the wettable metal pattern on the LED die may consist of bars, shown in FIG. 8, while the solder bumps on the submount are still in the form of a 4×4 array for the p-electrode plus two for the n-electrode. FIGS. 11a and 11b show cross-sectional views of this embodiment. FIG. 11a shows an embodiment that includes vias within a patterned dielectric 42 for solder pads 41 on the LED die. Likewise, a patterned dielectric 53 is provided with vias for solder pads 54 on the submount. In the embodiment shown in FIG. 11b, the solderable metal 41 on the LED die is made larger than the solder bumps in order to allow the solder to spread out and wet an area much larger than their individual diameters would provide. This results in a solder area coverage in excess of that of the sum of the individual bumps in FIG. 11a. Also, the solder thickness is effectively reduced. Both of these effects reduce the thermal resistance of the solder junction and allow the LED die to be driven to higher current densities for increased light output.

Figure 12A:
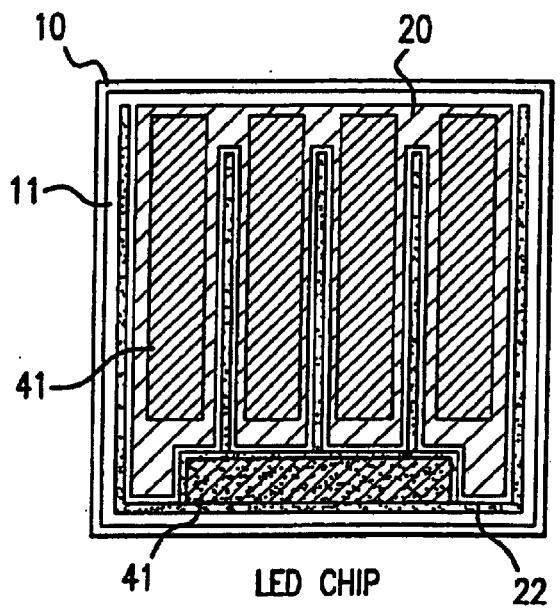
FIGS. 12a–b illustrate the plan views of an embodiment of the present invention, respectively.
Figure 12B:
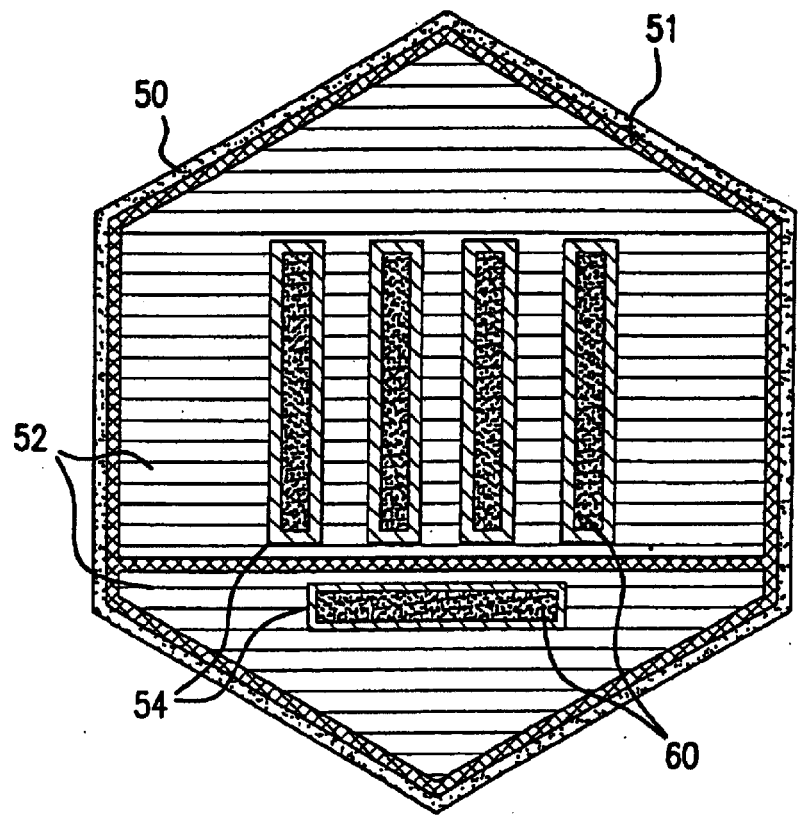

It is further possible to form the solder into arbitrary shapes other than bumps to match the wettable metal patterns on the LED to provide for a device with excellent thermal contact to the submount, shown in FIGS. 12a–b. FIG. 12a shows a plan view of the bottom of the LED. Solderable metals 41 are patterned on the p-electrode 20 and n-electrode 22 metallizations, defining wetting areas for the solder during reflow. Alternatively, the wetting areas may be defined by a dielectric passivation layer 42 as shown in FIGS. 6–8. FIG. 12b shows a plan view of the submount. While the lateral submount geometry is arbitrary, a hexagonal design is shown. The submount includes a substrate 50, e.g. Si. An optional dielectric layer 51, e.g. $SiO_2$, may be included for electrical isolation between the LED die and the submount substrate. Alternatively, the submount substrate may be electrically connected to the LED die for integration with electronic circuits fabricated into the submount substrate. Metallization 52, e.g. Ag or Al, is provided as a reflector for downwardly emitting light from the LED die as well as for wirebonding. A break in the metallization 52 is provided to electrically isolate the p and n regions of the LED die after attachment. Solderable metals 54 are patterned on top of the wirebond metallization 52 to define wetting areas for the solder during reflow. These patterns match those of the solderable metallization 41 on the LED die. As for the LED die, the wetting areas on the submount may be defined by a dielectric passivation layer 53 as shown in FIG. 10b. Solder material 60 is deposited on the submount solderable metallization 54. Alternatively, the solder material 60 may be deposited on the LED die. The edges of the solder may be recessed slightly from the edges of the solderable metal patterns 54. Control over the solder layout, defined by the wetting areas 41 and 54 and solder pattern 60, depends upon the solder application process. It is preferable that as much of the p-electrode 20 as possible is covered with solder after reflow. The wetting areas in FIGS. 12a–b provide ~66% coverage of the p-electrode 20 with solder. While the solder layout in FIGS. 12a–b is comprised of bars, arbitrary patterns are certainly possible and allow for further increase in solder area coverage of the p-electrode.

A suitable interconnect between the LED and submount can allow the maximum operating temperature of the LED to be increased beyond 130° C., the typical maximum rating. This is the case when the interconnect is thermally stable at temperatures greater than 130° C. In the case of solder, therefore, it is desirable to use high-temperature solders, e.g. 95/5 Pb/Sn, AuSn, AuSi, and AlSi, for this interface. A high-temperature interconnect raises the maximum junction temperature of the LED and provides a significant increase in maximum driving current and thus light generating capability.

It is important to maintain the integrity of the p electrode during solder reflow. That is, the reflectivity and contact resistance of this layer should not be degraded by the presence of solderable metal layers or the solder itself. Such degradation may be caused by metal intermixing between the p electrode and the solderable metal layers, or by strain-induced effects such as delamination. For this reason, it may be necessary to provide barrier layers between the p electrode and the solderable metals. Suitable barrier layers include, but are not limited to, Ni, Cr, Cu, and Ti.

For large LED die dimensions, the difference in the coefficient of thermal expansion (CTE) between the LED die, the submount, and the casing, may cause fatigue and eventual failure at the LED/submount attach interface under thermal cycling stress conditions. The CTE problem is most likely to occur for large sheet-solder attach designs than for smaller sheets (or bars or bumps). Therefore, smaller solder shapes may be a preferable method for attaching large LED die. Also, thicker solder sheets or taller solder bumps may provide more compliance between the LED and submount, reducing the risk of failure. The trade-off here between minimizing thermal resistance and the onset of CTE problems results in an optimum solder attach design for a given LED die size. For a 1 mm$^2$ die and 15% solder area coverage, the solder thickness may be as little as 20 $\mu$m without causing failures during temperature-cycling stress conditions.

Figure 13A:
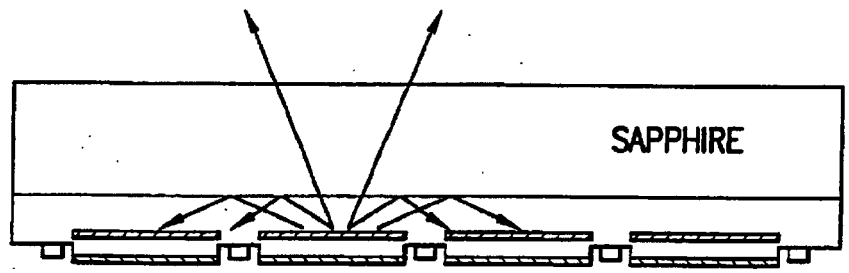
FIGS. 13a–c illustrate alternate embodiments of the present invention.
Figure 13B:
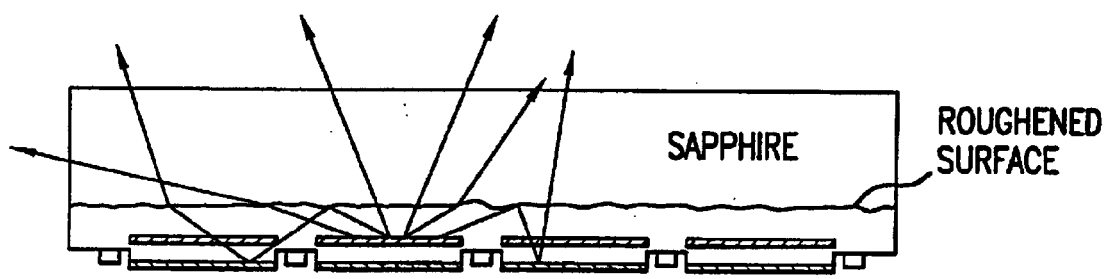
Figure 13C:
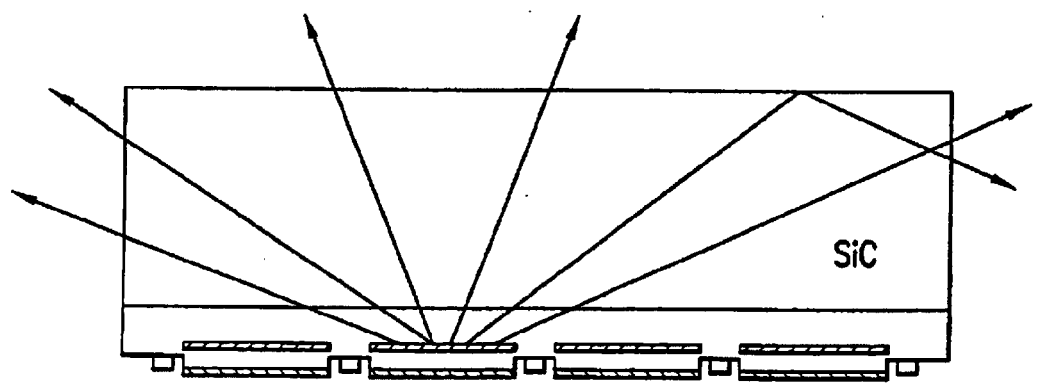

Light extraction of the LED can be increased by providing a textured surface at one of the interfaces of the III-nitride heterostructure. The texturing may be random or ordered. This is illustrated in FIGS. 13a–c. FIG. 13a shows an inverted device employing a sapphire superstrate. The large refractive index mismatch (n~0.6) between the sapphire superstrate and the III-nitride epitaxial layers results in a large portion of the light generated from the active region to be totally-internally-reflected at the sapphire/III-nitride interface. This light is trapped and guided laterally along the device towards the sides of the die. However, because of the many loss mechanisms present in the III-nitride epi layers and electrodes, most of the waveguided light is lost before escaping the device. In FIG. 13b, the interface between the III-nitride heterostructure and the sapphire superstrate is textured in order to scatter light out of the III-nitride layers. This reduces the mean photon path-length within the heterostructure and reduces the effect of internal absorption, thus improving light extraction. A similar effect can be achieved by texturing the bottom surface of the III-nitride heterstructure, or at one of the interfaces within the heterostructure. Multiple interfaces may be textured in combination to further increase light extraction.

In an alternate embodiment, light extraction is improved by providing an inverted die configuration which includes a high-refractive-index (HRI) (n>1.8) superstrate that has a closer index match to the III-nitride layers (n~2.4) than sapphire (n~1.8). A closer index match to the III-nitride layers making up the light generating regions allows more light to be coupled into the thick superstrate and allows light to escape into the ambient before absorption at one of the many loss mechanisms present in and around the III-nitride epitaxial layers. FIG. 13c illustrates such an embodiment, wherein a SiC superstrate is used. The refractive index of SiC is ~2.6 and is much closer matched to GaN than sapphire is. Thus, there is very little probability for total internal reflection and consequently no waveguide is formed within the III-nitride layers. Virtually all light generated from the active region is coupled into the superstrate and has a high probability for escape through one of the five exposed superstrate surfaces. Even with an HRI superstrate, further improvement in light extraction can be gained by texturing one or more interfaces of the III-nitride heterostructure.

Figure 14:
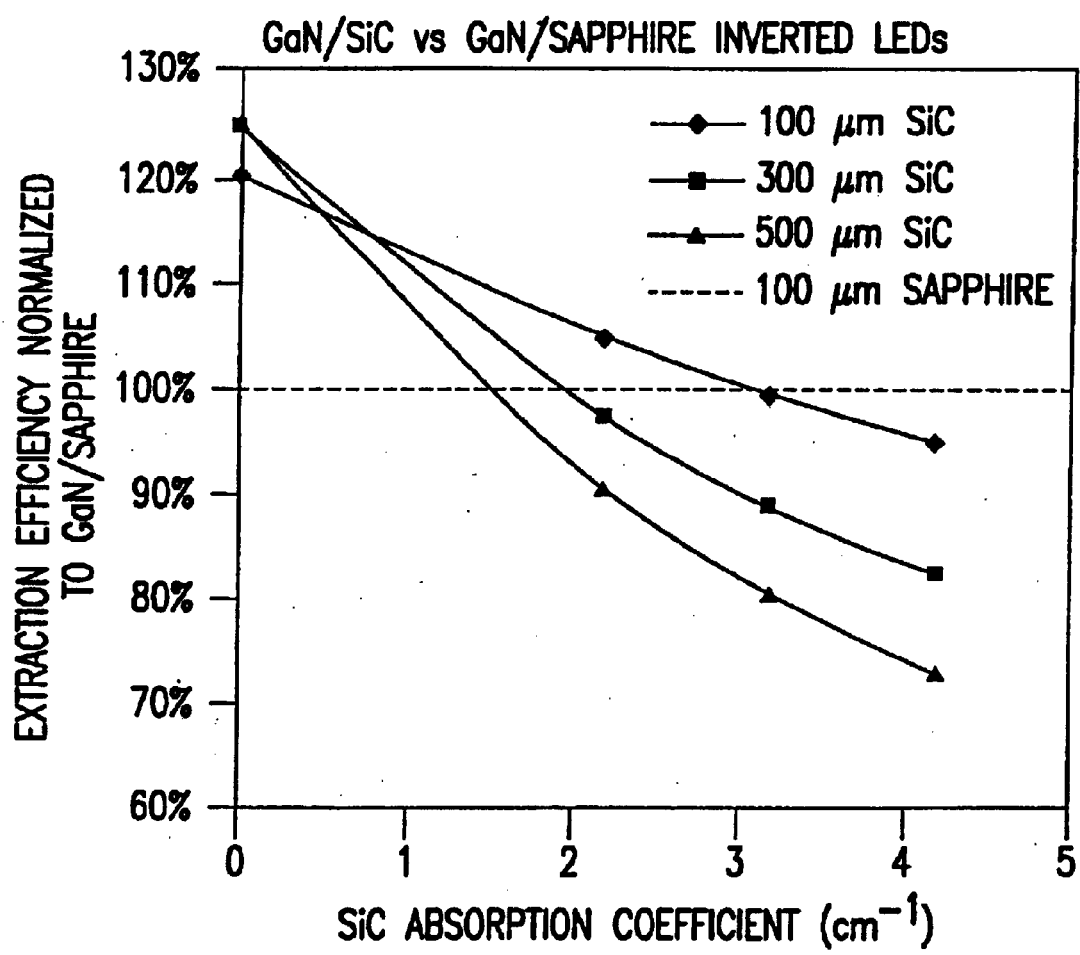
FIG. 14 shows extraction efficiency of GaN/SiC inverted LEDs as a function of the SiC absorption coefficient.

To derive full benefit of a HRI superstrate, the superstrate must be substantially transparent with very little absorption. Thus, for SiC, the superstrate should be lightly doped or not doped at all, and the growth method should provide a superstrate relatively free of impurities to provide a very low loss optical window for the LED device. For 6H SiC, this is generally the case when the resistivity is greater than 0.5 Ω cm. The effects of absorptive loss within SiC are quantified in FIG. 14, where extraction efficiency (normalized to a device using a sapphire superstrate) is plotted as a function of distributed loss (absorption coefficient, in cm$^{-1}$) within the SiC superstrate. These results are obtained by ray-trace modeling of the LED device structures. Three different thicknesses of SiC are shown. For a SiC superstrate ~100 $\mu$m thick, the absorption coefficient should be less than 3 cm$^{-1}$. For thicker substrates, the absorption coefficient must be lower. In the case of a lossless SiC superstrate, the extraction efficiency gains are greater than 1.2× over earlier embodiments within the present invention.

There are many HRI superstrates suitable for improving the light extraction efficiency of a III-nitride LED. In addition to SiC in its many different polytypes (2H, 4H, 6H, both c- and a-axis, 3C, etc.), other materials such as ZnS, ZnSe, YAG, or ZnO, may be used. The HRI superstrates may serve as growth substrates for the III-nitride epi layers or may be attached to the III-nitride epi layers by bonding or a second growth step.

Figure 15:
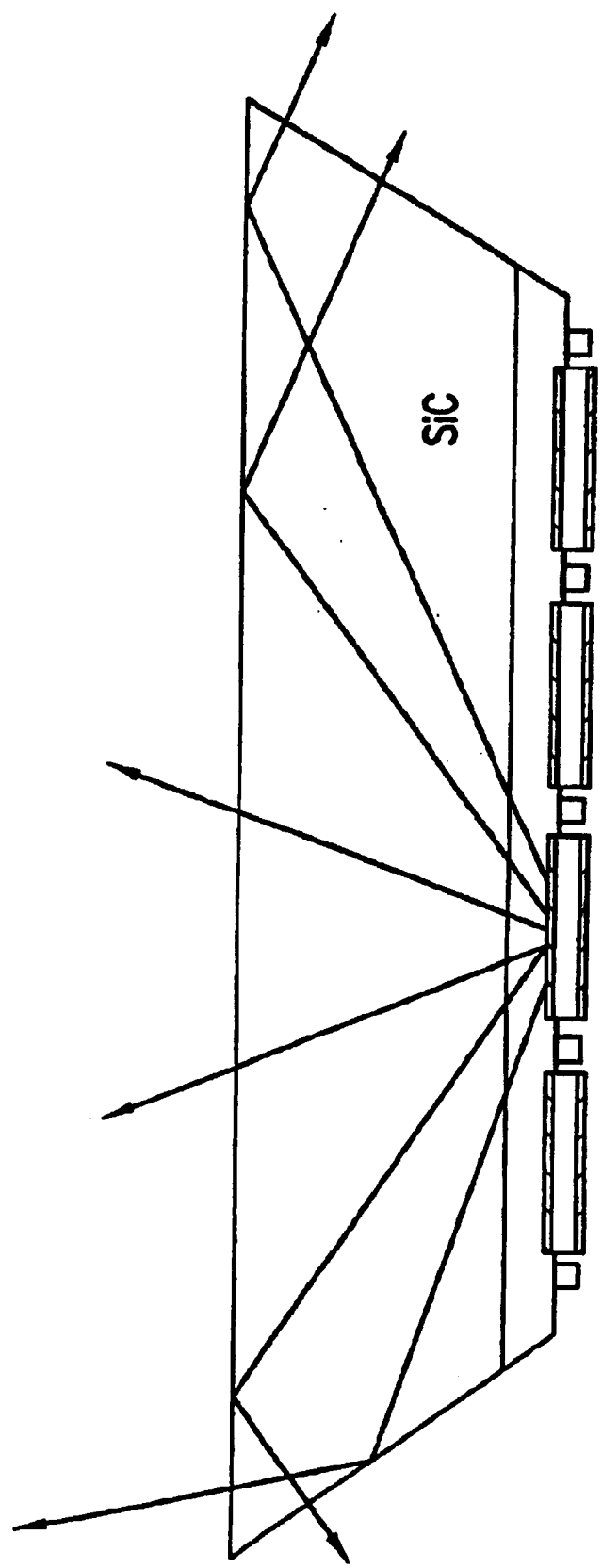
FIG. 15 illustrates an embodiment having an inverted pyramid for the superstrate.

Significant benefit to extraction efficiency may be obtained by providing a light-randomizing surface at one or more of the faces of the HRI superstrate as well as on or within the III-nitride heterostructure. Such surfaces are provided naturally on device sidewalls by sawing, for example, or may be achieved by other means, e.g. etching. Also, the superstrate may be shaped to provide for improved extraction efficiency as shown by Krames et. al. in Appl. Phys. Lett. 75, pp. 2365–2367. One such shape is an inverted pyramid design, such that the top surface of the superstrate has a surface area larger than that of its bottom surface. This embodiment is illustrated in FIG. 15.

The submount can provide functionality and affect performance. Because it is in the thermal path for heat removal from the LED, the submount material should have high thermal conductivity. Suitable materials include Si, AlN, or BeO. The submount should be relatively thin to reduce thermal resistance. For example, a Si submount should be less than 250 $\mu$m thick. Si is attractive as a submount material because of its good thermal conductivity, ~100 W/mK, and capability for integrated electronics. The submount may provide an electrical isolation between the LED and the package. In this case, two connections for the anode and cathode are required on the top surface of the submount to the package leads. Alternatively, if electrical isolation of the package is unnecessary and if the submount is conductive, one electrode can be contacted through the submount to the package. Then only one interconnect is required from the top of the submount to the opposing lead. The top surface metallization of the submount should be wire bondable and also reflective, to redirect downward travelling light upwards with high efficiency. Hence, Ag and Al are suitable choices for the submount top surface metallization.

Figure 16:
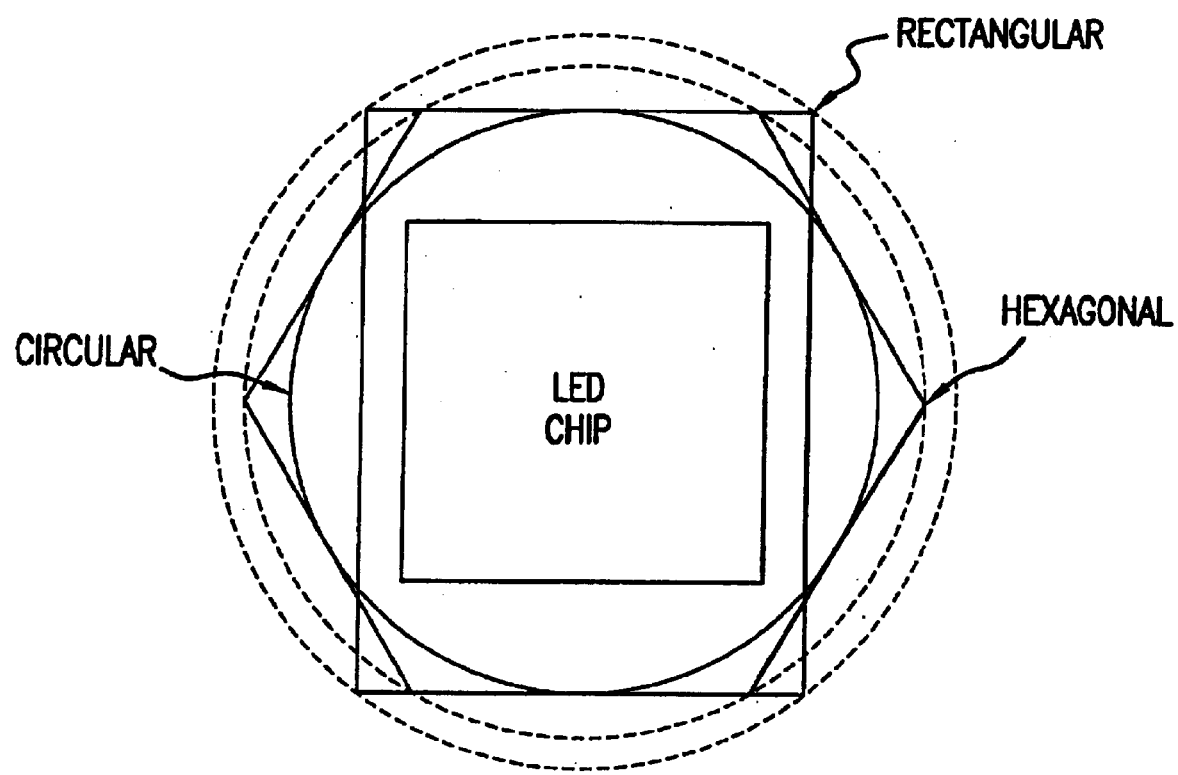
FIG. 16 illustrates alternate embodiments for the submount.

The submount shape, as well as the specularity of the reflective metallization atop the submount, can impact the optics in an LED lighting system by affecting the apparent source size of the LED. Most LEDs require a reflector cup to redirect light emitted predominantly laterally from the die upwards and within the useful radiation pattern. The larger this reflector cup must be, the larger the primary and any secondary lenses must be. Since optics costs are proportional to the volume of material required, it is desirable to minimize the reflector cup radius. The inclusion of a submount effectively increases the size of the LED die, because of the extra space needed for wirebond connections. Typical wirebond tolerances require that ~400 µm material extends beyond the LED die for reliable wirebonding. Also, dicing the submount wafer requires ~100 µm of space between neighboring LED die. These tolerances result in a significant effective increase in LED die size. For example, a 1×1 mm$^2$ LED die would require a 1.8×1.1 mm$^2$ area using a rectangular geometry for the submount. The largest extent of this submount is a diagonal equal to $(1.8^2+1.1^2)^{1/2}=2.11$ mm, which puts a lower limit on the diameter for the reflector cup. Instead, if the submount is shaped as a disk, the largest extent of the submount is merely 1.8 mm. Thus, a disk-shaped submount allows for a significant reduction in reflector cup diameter. Because circular cuts can be difficult to manufacture, other geometrical shapes which approximate circular disks are preferable. For example, hexagonal submounts may be fabricated by multiple-pass sawing (three passes instead of two) and are preferable to square or rectangular submounts. These ideas are illustrated in FIG. 16. The reflective metallization on top of the submount should be as specular as possible, so as not to create a virtual source in the plane of the submount which is larger than the LED die. A virtual source size larger than the LED die would have a deleterious effect on the radiation pattern of the LED and require larger optics to correct.

The submount, shown in FIGS. 6b, 9b, and 12b, allows for electronic functionality within the LED. III-nitride devices are susceptible to electro-static discharge (ESD) damage and may be protected by a power shunting element electrically connected to the LED as described in Antle et. al. U.S. Pat. No. 5,941,501. For the present invention, a Si submount may be embedded with circuitry for integrated ESD protection. In this case the protection circuits, e.g. Zener diodes, are connected in parallel with the LED die. Alternatively, back-to-back Zener diodes may be fabricated in parallel with the LED die to allow the LED to be driven by alternating-current power supplies. Other electronic devices may be included within the submount, e.g. photodetectors for monitoring light output or resistors for monitoring current and/or voltage. These devices will allow an integrated system to provide closed-loop feedback control for maintaining constant light-output operation.

Figure 17A:
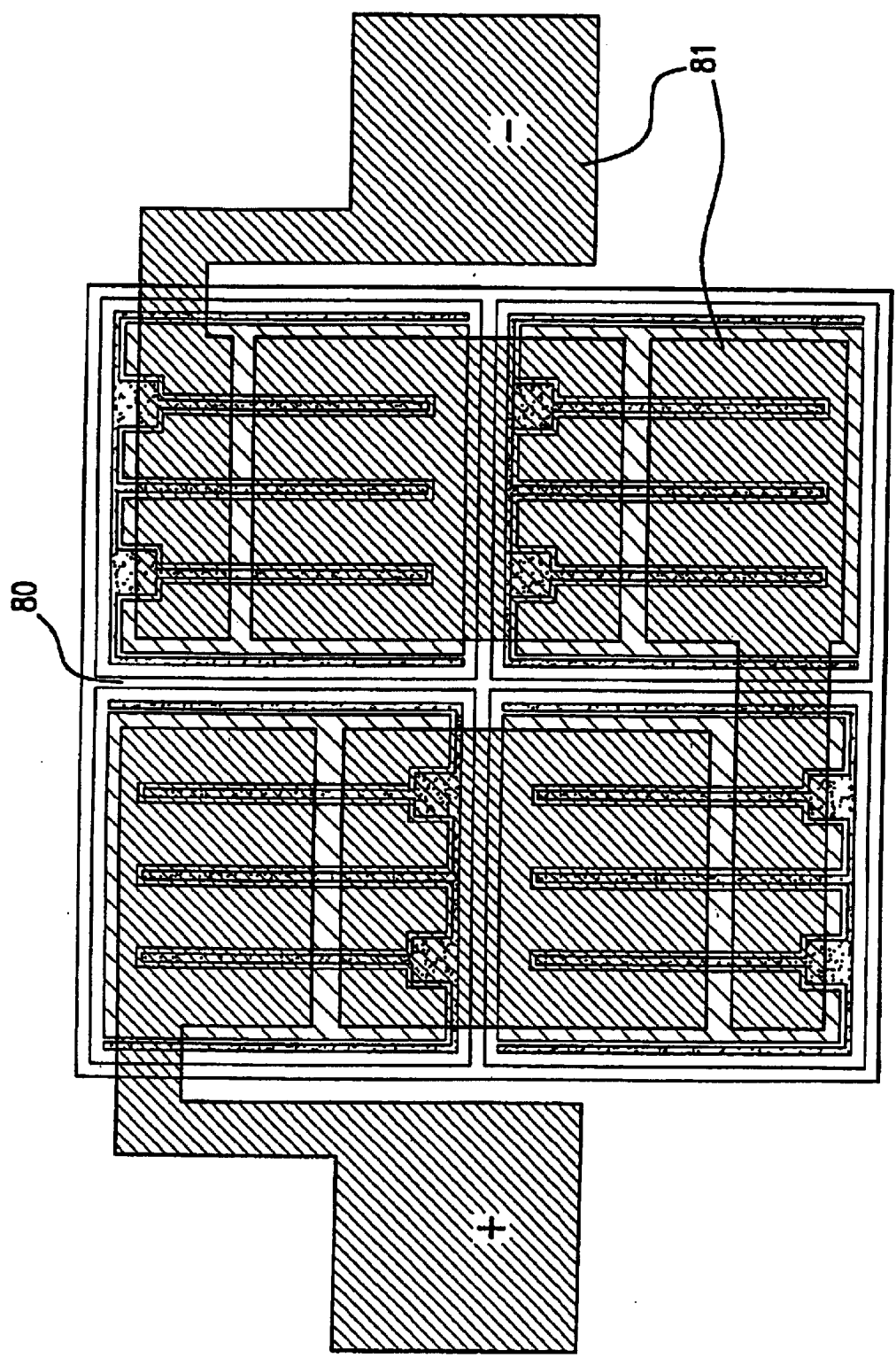
FIGS. 17a–b illustrates multiple series-interconnected light emitting structures according to the present invention.
Figure 17B:
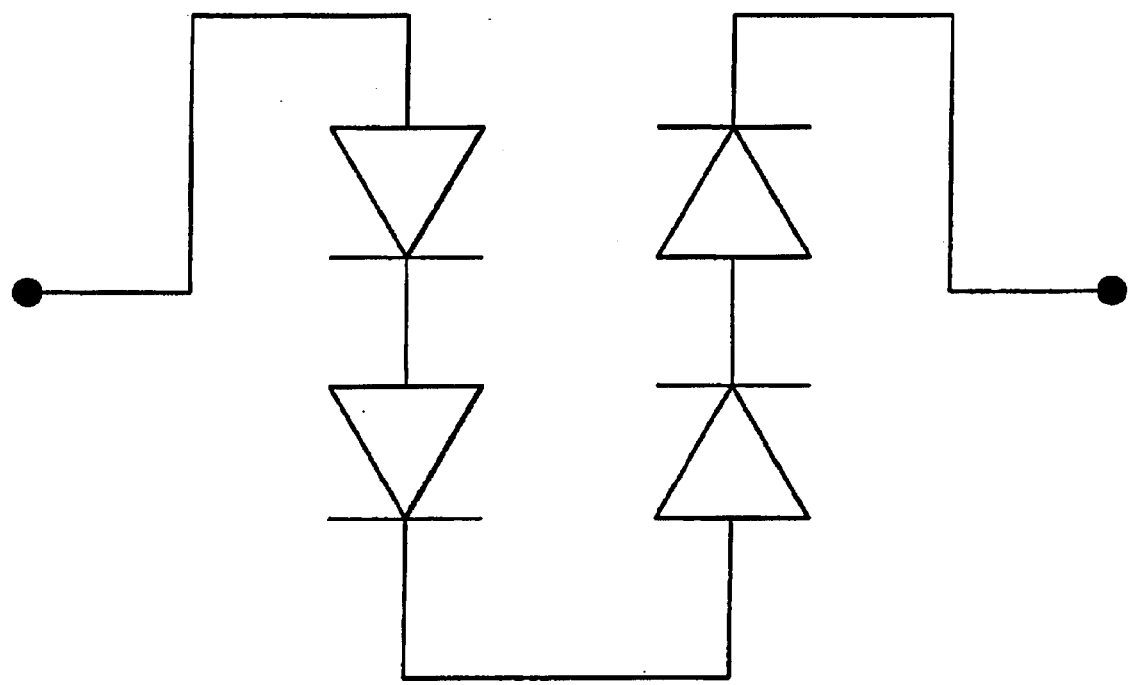
Figure 18:
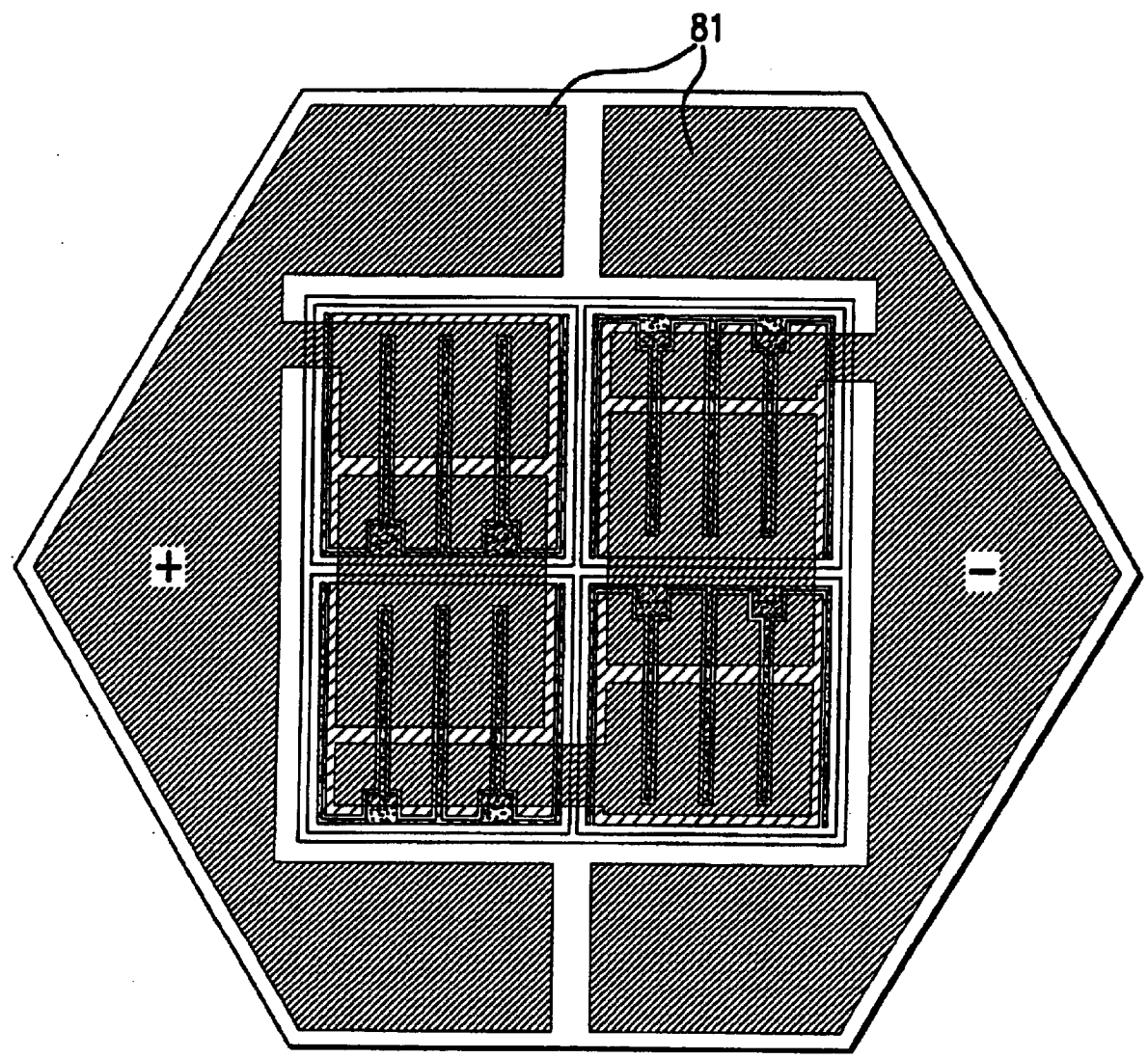
FIG. 18 illustrates multiple series-interconnected light emitting structures connected to a submount.

A submount provides for an LED based on multiple series-interconnected light-emitting diodes in a monolithic structure as shown in FIG. 17a. The assembly has four serially connected LEDs that are electrically isolated via etching to remove III-nitride material to form a trench 80 between them. The etching proceeds to at least the undoped III-nitride layers. The electrical interconnections are provided by metallic traces 81 laid out on the submount (not shown). The solder metallization is designed so that the diodes are electrically connected to the submount metallic traces via the solder. The resulting device may be represented by the electronic circuit shown in FIG. 17b. This device thus operates at 4× the voltage, and 4× less current, than a conventional LED of the same active junction area. For example, a 1 mm$^2$ conventional III-nitride LED may operate at 3.0 V and 350 mA. This same active junction area, broken up into four series-interconnected LEDs as shown in FIG. 17a, provides a device operating at 12.0 V and 87.5 mA. This higher voltage, lower current operation places less demand on the electronic driver circuit for the LED. In fact, the electronic driver circuit can run at higher efficiency at higher voltages, improving the overall efficiency of the LED lighting system. This embodiment, a monolithic device, is preferred over a conventional approach of attaching individual LED die in series. In the conventional approach, the total area taken up by the LED die is increased because of the tolerances required by die-attach machines. This undesirably increases the optical source size of the total LED and requires an increase in subsequent optics sizes in the LED system. In the preferred embodiment, the diodes may be spaced as close together as allowed by the trench etching for electrical isolation. The trench width may be as small as a few microns, so that the packing density of diodes in the embodiment can be very high. As shown in FIG. 18, the four 1 mm$^2$ LED die are monolithically fabricated and share a single superstrate and submount. The metal traces 81 on the submount electrically connect the four LEDs in series. While each 1 mm$^2$ LED normally operates at 3V, the four serially-connected LED module in FIG. 18 operates at 12V. The submount design is hexagonal to reduce the effective optical source size of the module. The trace metallization 81 is used for wirebonding for external connection and consists of a reflective metallization, e.g. Ag or Al.

Light extraction efficiency may be further improved by placing the active region layers near the highly reflective p-electrode. Assuming the p-electrode is a perfectly conducting metal, when the center of the active region is brought within approximately an odd multiple of quarter-wavelengths of light within the material ($\sim\lambda/4n$) from the reflective p-electrode, constructive interference of the downward and upward travelling light results in a radiation pattern that emits power preferentially in the upward direction. This enhancement is in a direction close to normal to the III-nitride/substrate and is not susceptible to total internal reflection back into the III-nitride epi layers. Alternatively, slight detuning of the resonance condition, by moving the active region slightly closer to (or farther from) the p-electrode reflector, may be preferred to optimize the light extraction improvement for total flux in all directions. For maximum efficiency in most applications, the distance between the active region and a perfectly conducting metal p-electrode should be approximately one quarter-wavelength.

Further retuning of the resonance condition for maximum extraction in a device with a nonideal metal contact depends on the phase shift of light reflecting off the metal. Methods for determining the phase shift of an actual reflective contact, then determining the optimal placement of an active region relative to that contact based on the phase shift are described below. Though the below description often uses the example of a III-nitride device formed on a sapphire substrate, it will be clear to a person of skill in the art that the methods described are readily applicable to other materials systems, other contact metals, and other growth substrates.

The total amount of light emitted from the LED (i. e., the total integrated flux) is the integrated flux emitted from the topside (towards the substrate) of the device added to the integrated flux emitted from the sides of the device. Side-emitted light is typically guided to the sides of the device by a waveguide created by reflective surfaces and various device layers having different indices of refraction. Waveguided light typically undergoes several reflections on its path to the side of the device, losing intensity with each reflection. In addition, light passing through the active region may be absorbed. Thus it is advantageous to extract as much light as possible from the topside of the device in the first pass, tending thereby to reduce internal losses and increase the total integrated flux.

Flipchip LEDs have a "top escape cone" near the active region such that light beams impinging on the topside from within the LED and lying within the escape cone exit directly from the topside of the device. For economy of language, we refer to the top escape cone merely as the "escape cone," understanding thereby that maximum topside light emission is a significant LED performance goal. The escape cone is determined by several device parameters including the indices of refraction of the various layers within the device. Light beams impinging on the topside outside the escape cone undergo total internal reflection. Such internally reflected light typically exits from the side of the device or undergoes further internal reflections and loss of intensity within the device. Thus, one approach to increasing the intensity emerging from the topside of the LED is to increase the flux impinging on the topside that lies within the escape cone.

Figure 21:
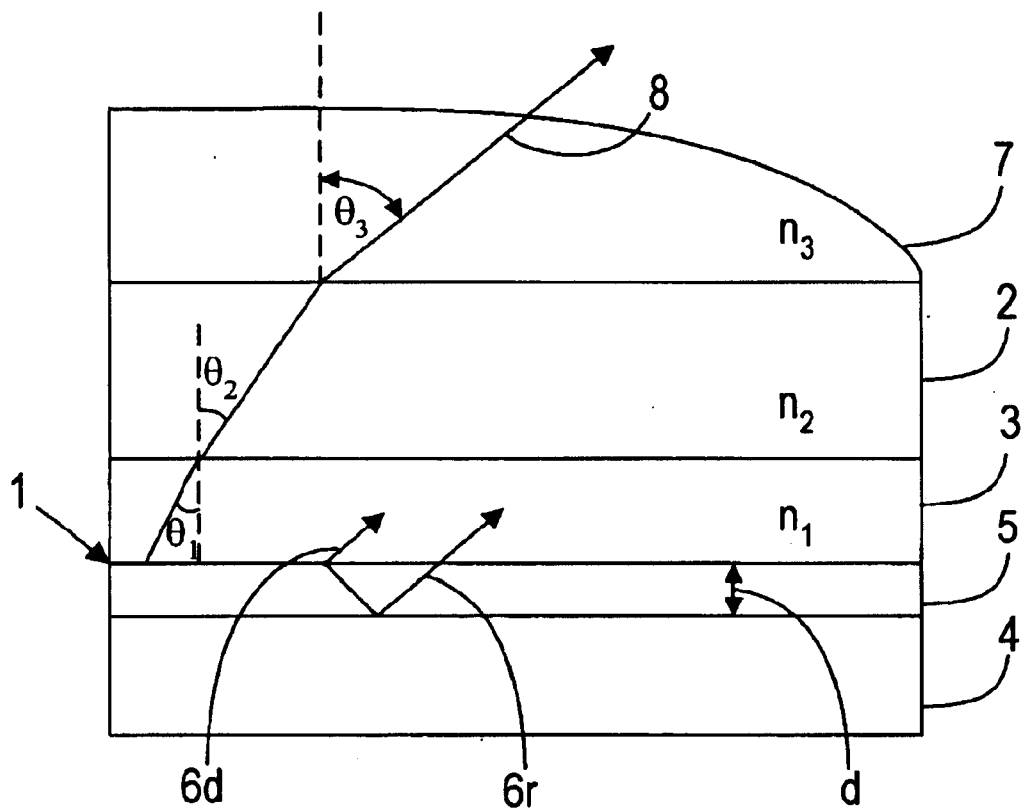
FIG. 21 illustrates a portion of light emitting device covered with an encapsulating gel.

FIG. 21 depicts a portion of a typical flipchip LED comprising a light emitting active region 1 and a transparent substrate 2 separated by a base layer 3. A base layer 3, comprising a single layer of one or more constituent sublayers, is typically grown epitaxially on the substrate 2 as a transition region between the substrate and the light emitting active region 1. Metal-Organic Chemical Vapor Deposition (MOCVD) may be used to grow one or more sublayers comprising the base layer, although other deposition techniques are known and used in the art.

The reflective positive ohmic contact 4 lies at a separation d from active region 1 and has one or more layers 5 lying between the active region 1 and the contact 4. Layer 5 can comprise one layer or can comprise multiple sublayers having distinct compositions, doping characteristics and refractive indices from sublayer to sublayer or a gradation of compositions, electrical properties and optical properties throughout the thickness of layer 5.

To be concrete in our descriptions, we consider in detail the case of a III-nitride device with a GaN base layer 3 and a single p-type layer 5, each of base layer 3 and p-type layer 5 having a substantially uniform index of refraction throughout. Generalizations to layers having non-uniform indices of refraction (such as arising from multiple layers of different materials, gradations of optical properties, and the like) is straight-forward by the use of optical distances obtained by summing or integrating (physical thickness of layer i)/(index of refraction of layer i) over various layers of base layer material. Therefore, examples presented herein for layers having a uniform index of refraction are illustrative and not limiting.

Light generated in active region 1 and emerging from the topside of the LED passes through base layer 3, substrate 2 and encapsulating gel 7 and undergoes refraction at each interface as depicted by beam 8 in FIG. 21. GaN base layer 3 has an index of refraction $n_1=2.4$. Sapphire substrate 2 has $n_2=1.8$ and a typical encapsulating gel 7 has $n_3=1.5$. Thus, refraction away from the normal occurs as depicted in FIG. 21, causing light 8 to emerge from substrate 2 into encapsulating gel 7 with an angle from the normal of $\theta_3$.

As light travels from the site of its formation into the encapsulating gel 7 through successive regions of lower index of refraction (3, 2 and 7), the possibility of total internal reflection arises at each interface. That is, if beam 8 strikes the 3-2 or 2-7 interface from the higher index side at too glancing an angle, no light will enter encapsulating gel 7.

Applying Snell's Law to FIG. 21 gives $n_1 \sin \theta_1 = n_2 \sin \theta_2 = n_3 \sin \theta_3$. The escape cone is determined by $\theta_3=90°$, or $\sin \theta_1(\text{escape})=(n_3/n_1)$. Using the above values for the indices of refraction for GaN, sapphire and encapsulating gel yields $\theta_1(\text{escape}) \approx 38.7°$. Thus, light striking the $n_1$-$n_2$ interface from the $n_1$ side will not emerge from the topside of the device if the angle of incidence exceeds $\theta_1(\text{escape})$, about $38.7°$.

Light emitted from electron-hole recombinations occurring in the active region 1 can be directed into the transparent substrate directly, such as beam 6d, or following reflection from ohmic contact 4 such as beam 6r. The coherence length (or pulse length) for light emitted in active region 1 is typically around 3 μm in GaN. Thus, if separation d is less than about 50% of the coherence length (d≤1.5 μm in GaN), interference between direct (6d) and reflected (6r) beams is expected to occur. The interference pattern can be influenced by the distance between active region 1 and reflective contact 4.

The reflected light 6r suffers a loss in intensity and a phase shift as it bounces off reflective contact 4. To increase the light output from a flip chip and to reduce intensity loss to contact 4, contact 4 may be chosen to have high reflectivity. For example, contact 4 may have a reflectivity greater than 80%, and usually has a reflectivity greater than 90%. The phase shift of the reflected light 6r depends on the n and k values of the metals or metal alloys used in reflective contact 4, and therefore, the phase shift will change depending on the metal type. This phase shift also influences the interference pattern. For a perfect conducting metal, the phase shift will be 180°. Generally, the contacts on real devices are not perfect conducting metals.

Once the phase shift of light reflected from reflective contact 4 is determined, the interference pattern of light escaping the device can be calculated as a function of the distance between active region 1 and reflective contact 4. As described above, the critical angle for light escaping from a GaN/sapphire/encapsulating gel interface is ~39 degrees, thus only the portion of light directed within this 39 degrees can escape through the topside of substrate 2. One way to increase light extraction from the light emitting device is to concentrate light intensity within the escape cone. Since the interference patterns emerging from the active region are controlled by the distance between active region 1 and reflective contact 4 for a given contact material, the light intensity within the escape cone may be maximized by appropriately selecting the distance between active region 1 and reflective contact 4.

The electric field of the directly emitted light 6d from a single quantum well active region is given by:

$$\vec{E}_0 = w_0 * \exp(-i \vec{k} * \vec{x}) \quad (1)$$

The electric field of the reflected light 6r from a single quantum well active region is given by:

$$\vec{E}_R = w_R * \exp(-i(\vec{k} * \vec{x} + \Phi + \Phi')) \quad (2)$$

where $w_0$ is the amplitude of emitted light 6d, $w_r$ is the amplitude of reflected light 6r, k is the direction vector, x is the position vector, $\Phi$ is the phase shift upon reflection off reflective contact 4, and $\Phi'$ is the phase shift due to the optical path length differences.

The intensity in the device, as a function of angle, $\theta$, is then given by:

$$|\vec{E}_{Total}|^2 = (\vec{E}_0 + \vec{E}_R)^*(\vec{E}_0 + \vec{E}_R) = w_0^2 = w_R^2 = 2w_0 w_R \cos(\Phi + \Phi'). \quad (3)$$

The phase shift due to optical path length difference $\Phi'$ depends on the distance d between the single quantum well active region 1 and reflective contact 4, the angle θ, the wavelength λ, and n (the index of refraction of the device layers, GaN in the above example) according to equation (4), where $\lambda_n=\lambda/n$:

$$\Phi' = 2\pi\frac{\Delta x}{\lambda_n} = 2\pi\frac{2d*\cos\theta}{\lambda_n}. \quad (4)$$

The phase shift due to reflection from reflective contact 4, Φ, can be calculated from the n and k values of the metal in reflective contact 4 if the metal is known. See, for example, Max Born & Emil Wolf, Principles of Optics, p. 628–630 (1980), which is incorporated herein by reference. If the n and k values of reflective contact 4 are not known, the phase shift Φ may be determined by, for example, the following method. A detector is positioned to collect light that is emitted through the substrate normal to a device under test, in a small collection cone (θ~6°). A series of devices having a varying distance between active region 1 and reflective contact 4 are fabricated including the material with unknown phase shift as reflective contact 4. If the wavelength of emitted light is constant, the extraction efficiency of the series of devices will only vary as a function of the distance d between active region 1 and reflective contact 4.

According to equation 3, the minimum in the extraction efficiency is located where $\Phi+\Phi'=m*\pi$ (m is an odd integer), where Φ' is the phase difference due to the optical path differences between directly emitting light 6d and reflected light 6r. With a series of devices each having a single quantum well placed at a different distance from reflective contact 4, the external quantum efficiency of reflective contact 4 may be measured by the detector as a function of distance between the single quantum well active region 1 and reflective contact 4. Using a second reflective contact 4 with a known phase shift, another curve of external quantum efficiency versus distance can be measured or calculated for a second set of devices with the same active-region-to-reflective-contact distances. External quantum efficiency is the product of internal quantum efficiency and extraction efficiency, $EQE=C_{ext}*IQE$, thus to eliminate the wafer to wafer differences in the internal quantum efficiency and to obtain the ratio of the extraction efficiencies, the points on the first curve can be divided by the points on the second curve, such that:

$$EQE_{unknown}/EQE_{known}=C_{ext,unknown}/C_{ext,known}. \quad (5)$$

Equation (3) may be substituted for $C_{ext,unknown}$ and $C_{ext,known}$, the measured values of external quantum efficiency for both devices may be substituted for $EQE_{unknown}$ and $EQE_{known}$, then Equation (5) may be solved for $\Phi_{unknown,metal}$. Since d, θ, λ, m, $\Phi_{known\ metal}$, and reflectivity are known, $\Phi_{unknown\ metal}$ can be calculated for any unknown reflective contact 4. Other methods may be used to determine Φ. See, for example, P. Maaskant et al., *Fabrication of GaN-based Resonant Cavity* LEDs, PHYS. STAT. SOL. (submitted Feb. 19, 2002).

Figure 22:
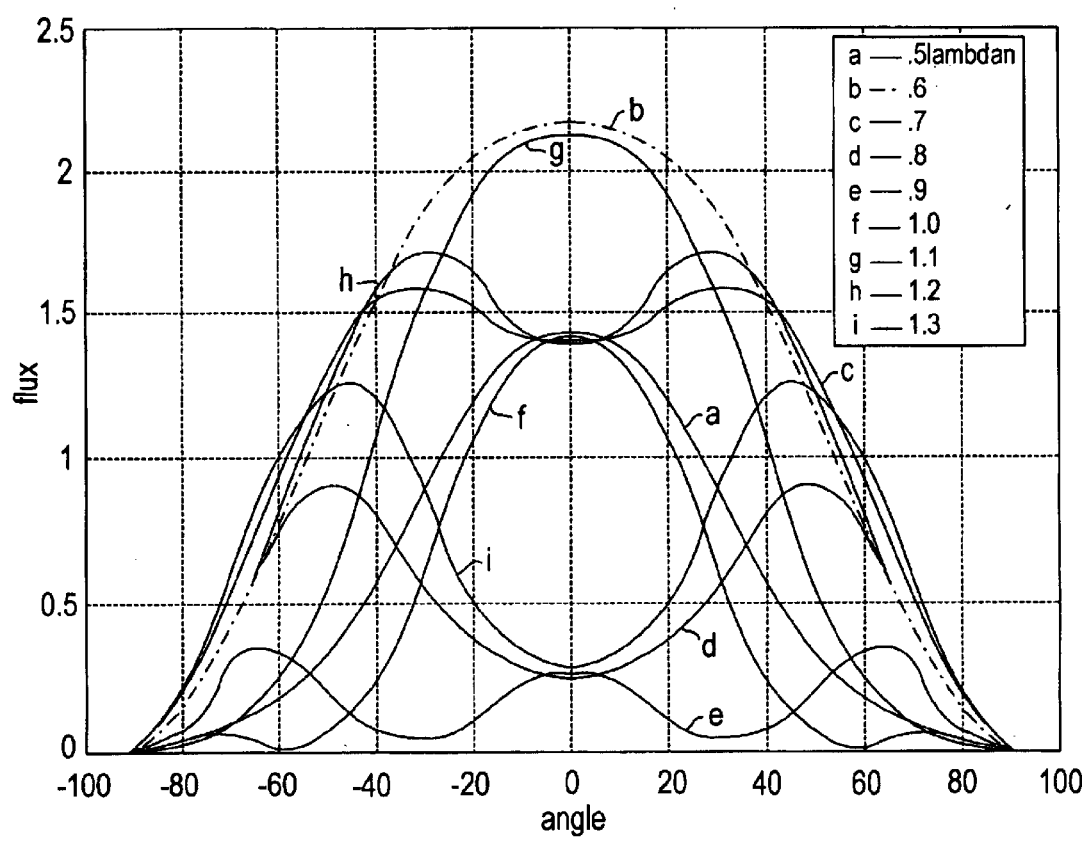
FIG. 22 illustrates the angular distribution of flux of light emitted from III-nitride single quantum well silver/nickel contact light emitting devices having different amounts of material separating the active region from the reflective contact. The devices are fabricated on sapphire substrates and are packaged with a silicone encapsulating gel. The amount of material separating the active region from the reflective contact is expressed in terms of wavelength, $\lambda_n$.

Once the phase shift due to reflection Φ is known, the intensity can be calculated as a function of distance d and angle θ using equation 3 above. FIG. 22 depicts computer-generated examples of the top-side far-field emitted light intensity (or flux) as a function of the direction of emission with respect to the normal to the LED, $\theta_3$, defined in FIG. 21. The curves in FIG. 22 are based on a single quantum well III-nitride device fabricated on a sapphire substrate with silicone as encapsulating gel 7. Various values of d are depicted, from curve a of FIG. 22 having $d=0.5\ \lambda_n$ to curve i of FIG. 22 having $d=1.3\ \lambda_n$, where $\lambda_n$ is the wavelength of the light in the semiconductor material separating the active region and the reflective contact. The units of flux are arbitrary as only the variations of flux with angle are of concern. The radiation patterns depend upon the distance, d, the wavelength of emitted light, the effective indices of refraction of the materials through which the light passes in exiting from the LED, among other factors. The radiation patterns clearly change as d changes, changing the flux lying within the escape cone of 38.7°.

As illustrated in FIG. 22, a maximum in total emitted flux may occur for a radiation pattern not peaked about the central perpendicular axis of the light emitting region. That is, spacing the reflective plane from the light emitting region such that flux intensity is directed primarily normal to the surface (0 deg. in FIG. 22 or "on-axis") does not necessarily lead to maximum total emitted flux. Curve "f" in FIG. 22 provides marked on-axis peaking of emitted radiation, but at a considerable sacrifice in the total emitted flux. Thus, spacing the light emitting region from the reflector so as to improve on-axis light emission may be suboptimal for obtaining maximal LED total brightness.

Figure 23:
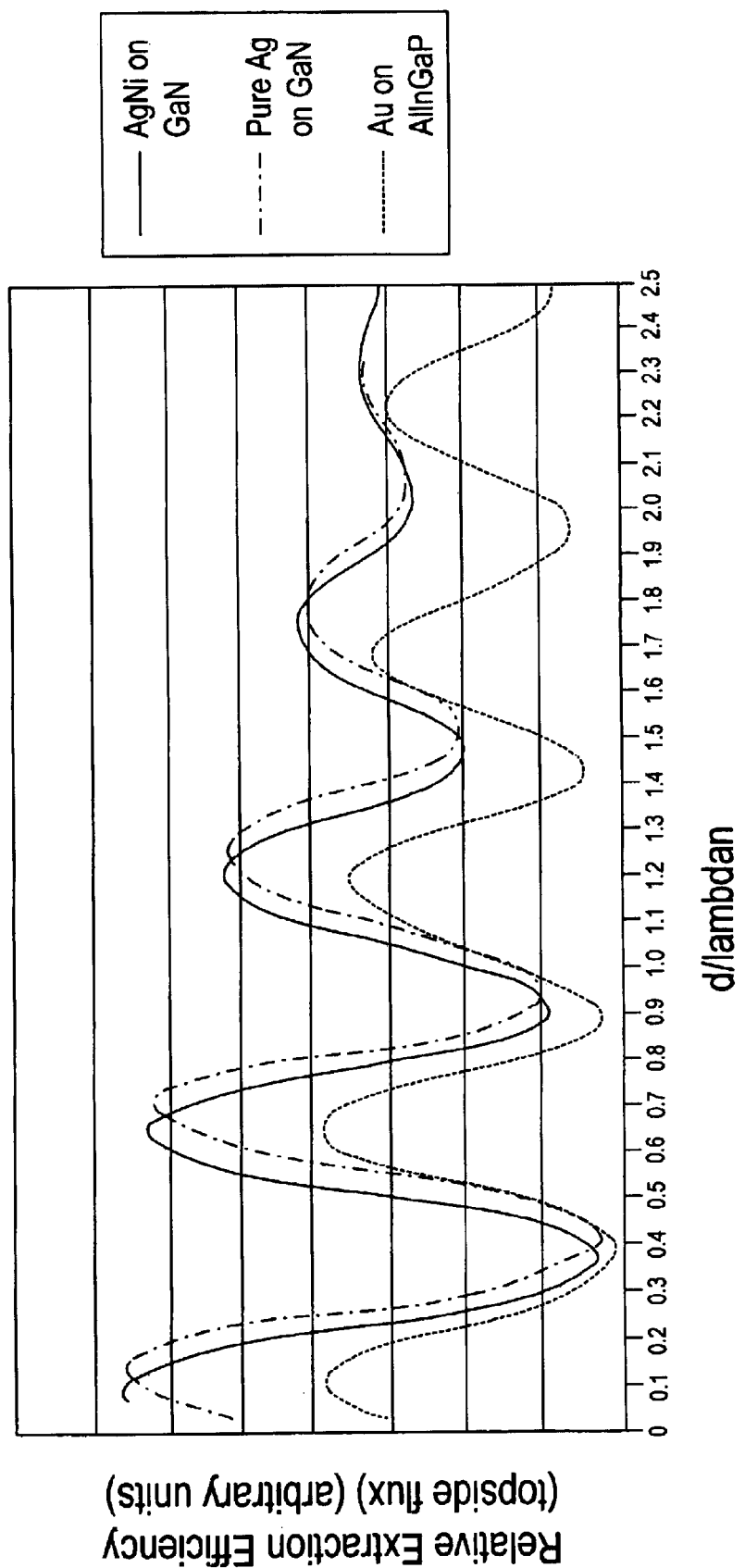
FIG. 23 illustrates extraction efficiency of top light as a function of separation between the active region and reflective contact for three devices.

The curves in FIG. 22 may be integrated to generate curve a of FIG. 23. FIG. 23 illustrates, for three devices, computer generated plots of extraction efficiency of top-side flux as a function of distance between active region 1 and reflective contact 4 divided by $\lambda_n$. Curve a in FIG. 23 represents the results for a 450 nm III-nitride single quantum well device with a sapphire substrate, a silicone encapsulating gel, and a reflective contact having a thin layer of nickel adjacent to the semiconductor layers and a thick layer of silver adjacent to the nickel. A first maximum in the extraction efficiency shown in curve a occurs between about $0.01\lambda_{and}$ about $0.15\lambda_n$, a second maximum between about $0.6\lambda_n$ and about $0.7\lambda_n$, a third maximum in extraction efficiency occurs between about $1.15\lambda_n$ and about $1.25\lambda_n$, a fourth maximum in extraction efficiency occurs between about $1.65\lambda_n$ and about $1.75\lambda_n$. Thus, for maximum extraction efficiency in a 450 mn III-nitride device with a (thin Ni)/Ag contact, the center of a single quantum well active region 1 should be placed between about $0.01\lambda_n$ and about $0.15\lambda_n$, between about $0.5\lambda_n$ and about $0.8\lambda_n$, between about $1.05\lambda_n$ and about $1.35\lambda_n$, or between about $1.6\lambda_n$ and about $1.9\lambda_n$ from reflective contact 4. The first maximum is generally not used as the first maximum places the active region so close to the reflective contact that the contact may absorb power from the active region, creating evanescent waves which prevent the active region from emitting light.

The location of the maxima in a curve of extraction efficiency vs. distance may shift as the wavelength of the light changes. The wavelength of the light affects the phase shift due to reflection from the metal, Φ. If Φ is calculated from known n and k values, the calculation takes into account the wavelength. If Φ is measured as described above, Φ must be measured for a particular wavelength to ensure proper selection of the distance between the active region and the reflective contact. The table below lists spacing ranges d between a single III-nitride quantum well and a Ni/Ag contact corresponding to the second, third, and fourth maxima in a plot of extraction efficiency vs. d for three different wavelength devices.

| n = 2.4 | 450 nm device d/λ$_n$ | 505 nm device d/λ$_n$ | 530 nm device d/λ$_n$ |
|---|---|---|---|
| Possible | 0.5–0.8 | 0.53–0.83 | 0.55–0.85 |
| Usual | 0.6–0.7 | 0.63–0.73 | 0.65–0.75 |
| Possible | 1.05–1.35 | 1.08–1.38 | 1.1–1.4 |
| Usual | 1.15–1.25 | 1.18–1.28 | 1.2–1.3 |
| Possible | 1.6–1.9 | 1.63–1.93 | 1.65–1.95 |
| Usual | 1.65–1.75 | 1.68–1.78 | 1.7–1.8 |

The table below lists the same information, expressed in nanometers instead of in terms of the wavelength of the light.

| n = 2.4 | 450 nm device d/λ$_n$ | 505 nm device d/λ$_n$ | 530 nm device d/λ$_n$ |
|---|---|---|---|
| Possible | 93.8–150.0 | 111.5–174.6 | 121.5–187.7 |
| Usual | 112.5–131.3 | 132.6–153.6 | 143.5–165.6 |
| Possible | 196.9–253.1 | 227.3–290.4 | 242.9–309.2 |
| Usual | 215.6–234.4 | 248.3–269.3 | 265.0–287.1 |
| Possible | 300.0–356.3 | 343.0–406.1 | 364.4–430.6 |
| Usual | 309.4–328.1 | 353.5–374.5 | 375.4–397.5 |

Though the above example is directed to a III-nitride device with a nickel/silver contact, a silicone encapsulating gel, and a sapphire substrate, it will be apparent to a person of skill in the art that the method of choosing the spacing between the active region and reflective contact can be applied to other materials systems including but not limited to III-phosphide, III-arsenide, and II–VI, to other contact materials, to other encapsulating materials, and to other substrates.

Figure 24:
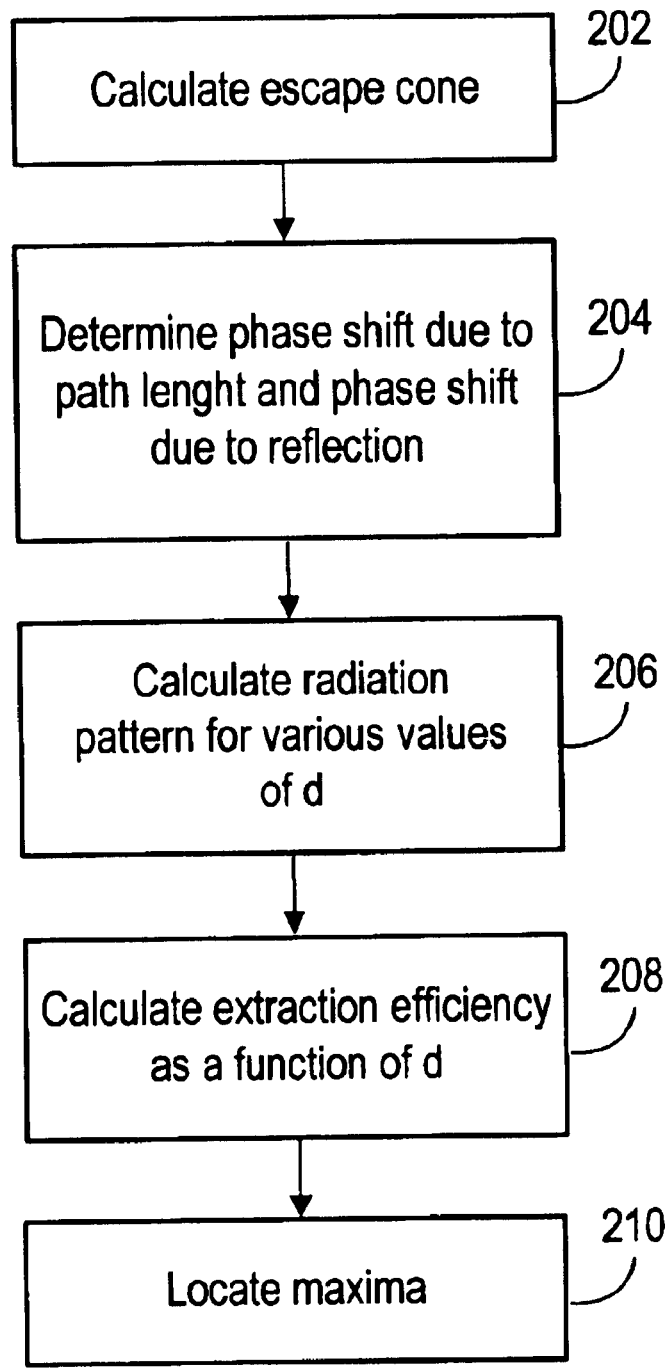
FIG. 24 illustrates a method of determining the separation between the active region and reflective contact of a light emitting device.

FIG. 24 illustrates a generic method for determining the spacing between the active region and reflective contact in accordance with the present invention. First, in stage 202, the escape cone is calculated using the index of refraction of the semiconductor material, the substrate, and the encapsulation material or air, if no encapsulation material is used. In stage 204, the phase shift due to optical path length and phase shift due to reflection are then calculated or measured, as described above. The phase shift due to optical path length and phase shift due to reflection depend on the material used in the reflective contact and the wavelength of the light. In stage 206, the radiation pattern is calculated for various spacings between the active region and reflective contact using the phase shifts determined in stage 204, yielding a graph such as FIG. 22. The radiation pattern depends on the wavelength of light. In stage 208, the extraction efficiency is calculated as a function of the distance d between the active region and the reflective contact. The extraction efficiency depends on the radiation pattern calculated in stage 206 and the escape cone calculated in stage 202. An example of extraction efficiency as a function of d is illustrated in FIG. 23. The maxima in the plot of extraction efficiency as a function of d are identified in stage 210, which determine the spacing between the active region and the reflective contact which outputs the most light.

Curve b of FIG. 23 illustrates the results of the method described in FIG. 24 for a 450 nm III-nitride device with a pure silver contact. A first maximum in extraction efficiency occurs between about 0.65λ$_n$ and about 0.75λ$_n$, a second maximum in extraction efficiency occurs between about 1.15λ$_n$ and about 1.38λ$_n$, a third maximum in extraction efficiency occurs between about 1.73λ$_n$, and about 1.85λ$_{and}$ a first minimum in extraction efficiency occurs at about 0.96λ$_n$. Thus, for maximum extraction efficiency in a III-nitride device with a silver contact, the center of a single quantum well active region 1 should be placed between about 0.5λ$_n$ and about 0.9λ$_n$, between about 1.0λ$_n$ and about 1.4λ$_n$, or between about 1.5λ$_n$ and about 1.9λ$_n$ from reflective contact 4.

The method described in FIG. 24 may be used to determine the separation between the reflective contact and active region of a III-phosphide device, where the device layers are Al$_x$In$_y$Ga$_z$P, wherein $0 \leq x \leq 1$, $0 \leq y \leq 1$, $0 \leq z \leq 1$, and $x+y+z=1$. III-phosphide devices often have an AlInP layer adjacent to the active region, and a GaInP contact layer adjacent to the reflective contact. The reflective contact is selected for ohmic contact with GaInP. Examples of suitable reflective contact materials are Al, Ag, and Au. The reflective contact metal may be alloyed to the GaInP, which may reduce the reflectivity of the contact. To alleviate a trade-off between ohmic properties and reflective properties, a two-part contact may be used. To form a two part contact, first a layer of suitable ohmic metal is deposited and alloyed to the GaInP. Then, the metal is etched into a pattern of fine lines whereby most of the surface area of the GaInP is revealed, the fine lines serving to conduct current into the device. The exposed areas of the GaInP are then chemically etched away revealing the AlInP cladding layer beneath, thereby eliminating a large part of the adsorbing GaInP from the optical path. Finally, a suitable reflector, chosen for its optical properties without regard to the resistivity of the contact it makes to the AlInP, is deposited over both the fine lines of the first metal and the exposed AlInP. In this manner, current is conducted into the device by the first metal, and a highly reflective second metal serves as a mirror.

Curve c of FIG. 23 illustrates the results of the method described in FIG. 24 for a 625 nm III-phosphide device (n=3.4) with a gold contact. A first maximum in extraction efficiency occurs between about 0.05λ$_n$ and about 0.2λ$_n$, a second maximum in extraction efficiency occurs between about 0.6λ$_n$ and about 0.75λ$_n$, a third maximum in extraction efficiency occurs between about 1.1λ$_n$), and about 1.25λ$_n$, a fourth maximum in extraction efficiency occurs between about 1.6λ$_n$ and about 1.8λ$_n$), and a fifth maximum in extraction efficiency occurs between about 2.18λ$_n$ and about 2.28λ$_n$. Thus, for maximum extraction efficiency in a III-phosphide device with a gold contact, the center of a single quantum well active region 1 should be placed between about 0.52λ$_n$ and about 0.78λ$_n$, between about 1.02λ$_n$ and about 1.3λ$_n$, between about 1.55λ$_n$ and about 1.82λ$_n$, or between about 2.09λ$_n$ and about 2.33λ$_n$ from reflective contact 4.

FIG. 23 presents data for single quantum well (SQW) active regions. However, the methods described herein are not limited to SQW devices and can also be used in connection with multiple quantum well (MQW) active regions. For example, the center of brightness and/or physical center of MQW active regions may be placed at a separation corresponding to a maximum on the appropriate plot of extraction efficiency of top-side flux as a function of distance between the active region and the reflective contact. Alternatively (or additionally) MQWs may be present in clusters comprising one or more quantum wells in each cluster. The center of brightness of each cluster may be placed at a separation corresponding to a maximum on the appropriate plot of extraction efficiency of top-side flux as a function of distance between the active region and the reflective contact.

Figure 19:
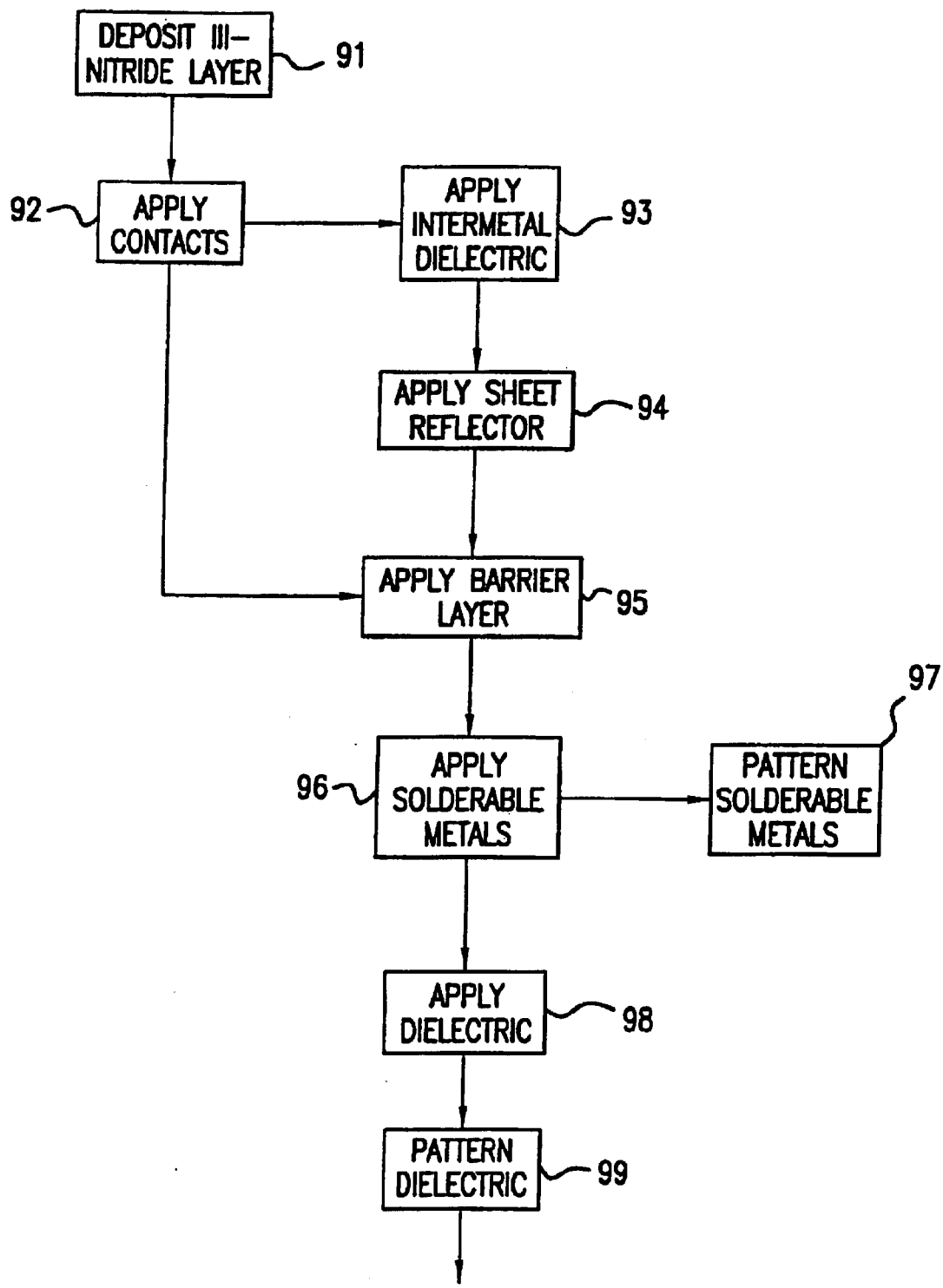
FIG. 19 illustrates a flowchart for manufacturing the III-nitride LED.

FIG. 19 illustrates a process flowchart for fabricating the LED die. In step 91, a III-nitride heterostructure is deposited on a growth substrate. In step 92, contacts are applied to the III-nitride heterostructure, etching if necessary. The p-contact is opaque and electrically connected to the p-type layer while the n-contact is electrically connected to the n-type layer. In optional steps 93 and 94, an intermetal dielectric is applied over at least the n-contact in regions where the n-contact interposes the p-contact and a sheet reflector is applied respectively. In step 95, an optional barrier layer is applied to protect the contacts and reflector from solder. In step 96, solderable metals are applied. In optional step 97, the solderable metals are patterned. In step 98, dielectric is applied to define the solderable areas. In step 99, the dielectric is patterned. The LED die may be attached to the submount after step 97 or step 99.

Figure 20:
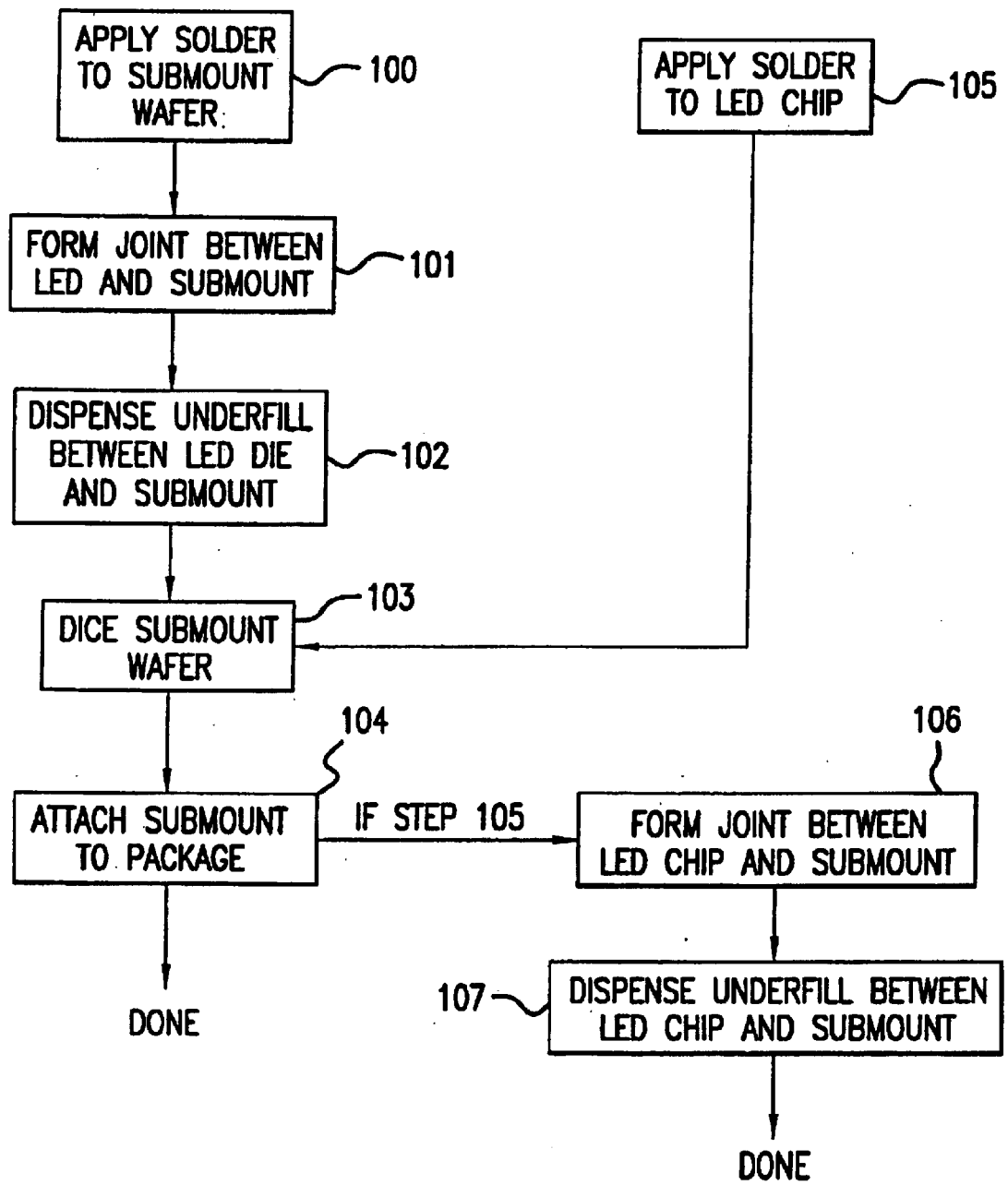
FIG. 20 illustrates a flowchart for attaching the III-nitride LED to a submount.

FIG. 20 illustrates a process flowchart for attaching the LED to the submount. In step 100, solder is applied to the submount wafer. In step 101, a joint is formed between the LED die and the submount. In optional step 102, underfill is dispensed between the LED die and the submount. In step 103, the submount wafer is separated. In step 104, the die and submount are attached to the package.

Alternatively, step 105 is completed in lieu of steps 100, 101, and 102. In step 105, solder is applied to the LED. In step 106, a joint is formed between the LED die and the submount wafer. In optional step 107, underfill is dispensed between the LED die and submount.

Although the present invention is described in connection with certain specific embodiments for instructional purposes, the present invention is not limited thereto. The depictions of various structures in the various diagrams are illustrative, and are not meant to limit the invention. Various modifications, adaptations, and combinations of various features of the described embodiments can be practiced without departing from the scope of the invention as defined in the following claims.

We claim:

1. A light emitting diode comprising:
   a light emitting region capable of emitting radiation; and
   a reflector reflective of the radiation and separated from the light emitting region by a separation, wherein the separation is such that interferences between direct and reflected beams of the emitted radiation cause radiation to concentrate in a top escape cone of the light emitting device.

2. The light emitting diode of claim 1 wherein the radiation is concentrated in a top escape cone of the light emitting device, but not on a central perpendicular axis of the light emitting region.

3. A light emitting diode comprising:
   a light emitting region capable of emitting radiation; and
   a reflector reflective of the radiation;
   wherein the reflector is separated from the light emitting region by a separation ranging between about $0.5\lambda_n$ about $0.9\lambda_n$, wherein $\lambda_n$ is the wavelength of the radiation within a region separating the light emitting region from the reflector.

4. The light emitting diode of claim 3 wherein the reflector comprises silver and nickel.

5. The light emitting diode of claim 4 wherein the light emitting region comprises $Al_xIn_yGa_zN$, wherein $0 \leq x \leq 1$, $0 \leq y \leq 1$, $0 \leq z \leq 1$, and $x+y+z=1$.

6. The light emitting diode of claim 4 wherein the separation is between about $0.6\lambda_n$ and about $0.75\lambda_n$.

7. The light emitting diode of claim 4 wherein:
   the radiation has a wavelength of 450 nm in a vacuum; and
   the separation is between about 93.8 nm and about 150.0 nm.

8. The light emitting diode of claim 4 wherein:
   the radiation has a wavelength of 505 nm in a vacuum; and
   the separation is between about 111.5 nm and about 174.6 nm.

9. The light emitting diode of claim 4 wherein:
   the radiation has a wavelength of 530 nm in a vacuum; and
   the separation is between about 121.5 nm and about 187.7 nm.

10. The light emitting diode of claim 3 wherein the reflector comprises silver.

11. The light emitting diode of claim 10 wherein the light emitting region comprises $Al_xIn_yGa_zN$, wherein $0 \leq x \leq 1$, $0 \leq y \leq 1$, $0 \leq z \leq 1$, and $x+y+z=1$.

12. The light emitting diode of claim 10 wherein the separation is between about $0.65\lambda_n$ and about $0.754\lambda_n$.

13. The light emitting diode of claim 3 wherein the reflector comprises one of gold and gold alloy.

14. The light emitting diode of claim 13 wherein the light emitting region comprises $Al_xIn_yGa_zP$, wherein $0 \leq x \leq 1$, $0 \leq y \leq 1$, $0 \leq z \leq 1$, and $x+y+z=1$.

15. The light emitting diode of claim 13 wherein the separation is between about $0.6\lambda_n$ and about $0.75\lambda_n$.

16. The light emitting diode of claim 3 wherein the reflector has a reflectance greater than 80%.

17. The light emitting diode of claim 3 wherein the reflector has a reflectance greater than 90%.

18. The light emitting diode of claim 3 wherein the light emitting region comprises a plurality of quantum wells.

19. The light emitting diode of claim 18 wherein the separation is from a center of brightness of the plurality of quantum wells to the reflector.

20. The light emitting diode of claim 3 further comprising:
   a region of first conductivity type near a first side of the light emitting region;
   a region of second conductivity type near a second side of the light emitting region;
   a first contact electrically connected to the region of first conductivity type;
   a second contact electrically connected to the region of second conductivity type; and
   a submount electrically connected to the first and second contacts.

21. The light emitting diode of claim 20 further comprising a lens overlying the light emitting region.

22. A light emitting diode comprising:
   a light emitting region capable of emitting radiation; and
   a reflector reflective of the radiation;
   wherein the reflector is separated from the light emitting region by a separation ranging between about $\lambda_n$ and about $1.4\lambda_n$, wherein $\lambda_n$ is the wavelength of the radiation within a region separating the light emitting region from the reflector.

23. The light emitting diode of claim 22 wherein:
   the reflector comprises silver and nickel;
   the light emitting region comprises $Al_xIn_yGa_zN$, wherein $0 \leq x \leq 1$, $0 \leq y \leq 1$, $0 \leq z \leq 1$, and $x+y+z=1$; and
   the separation is between about $1.05\lambda_n$ and about $1.4\lambda_n$.

24. The light emitting diode of claim 23 wherein the separation is between about $1.15\lambda_n$ and about $1.3\lambda_n$.

25. The light emitting diode of claim 23 wherein:

the radiation has a wavelength of 450 nm in a vacuum; and the separation is between about 196.9 nm and about 253.1 nm.

26. The light emitting diode of claim 23 wherein:

the radiation has a wavelength of 505 nm in a vacuum; and the separation is between about 227.3 nm and about 290.4 nm.

27. The light emitting diode of claim 23 wherein:

the radiation has a wavelength of 530 nm in a vacuum; and the separation is between about 242.9 nm and about 309.2 nm.

28. The light emitting diode of claim 22 wherein:

the reflector comprises silver;

the light emitting region comprises $Al_xIn_yGa_zN$, wherein $0 \leq x \leq 1$, $0 \leq y \leq 1$, $0 \leq z \leq 1$, and $x+y+z=1$; and the separation is between about $1.15\lambda_n$ and about $1.38\lambda_n$.

29. The light emitting diode of claim 22 wherein:

the reflector comprises one of gold and gold alloy;

the light emitting region comprises $Al_xIn_yGa_zP$, wherein $0 \leq x \leq 1$, $0 \leq y \leq 1$, $0 \leq z \leq 1$, and $x+y+z=1$; and the separation is between about $1.1\lambda_n$ and about $1.25\lambda_n$.

30. The light emitting diode of claim 22 wherein the light emitting region comprises a plurality of quantum wells.

31. The light emitting diode of claim 30 wherein the separation is from a center of brightness of the plurality of quantum wells to the reflector.

32. A light emitting diode comprising:

a light emitting region capable of emitting radiation; and a reflector reflective of the radiation;

wherein the reflector is separated from the light emitting region by a separation ranging between about $1.55\lambda_n$ and about $1.95\lambda_n$, wherein $\lambda_n$ is the wavelength of the radiation within a region separating the light emitting region from the reflector.

33. The light emitting diode of claim 32 wherein:

the reflector comprises silver and nickel;

the light emitting region comprises $Al_xIn_yGa_zN$, wherein $0\ 0 \leq x \leq 1$, $0 \leq y \leq 1$, $0 \leq z \leq 1$, and $x+y+z=1$; and the separation is between about $1.65\lambda_n$ and about $1.8\lambda_n$.

34. The light emitting diode of claim 32 wherein:

the reflector comprises silver;

the light emitting region comprises $Al_xIn_yGa_zN$, wherein $0 \leq x \leq 1$, $0 \leq y \leq 1$, $0 \leq z \leq 1$, and $x+y+z=1$; and the separation is between about $1.73\lambda_n$ and about $1.85\lambda_n$.

35. The light emitting diode of claim 32 wherein:

the reflector comprises one of gold and gold alloy;

the light emitting region comprises $Al_xIn_yGa_zP$, wherein $0 \leq x \leq 1$, $0 \leq y \leq 1$, $0 \leq z \leq 1$, and $x+y+z=1$; and the separation is between about $1.6\lambda_n$ and about $1.8\lambda_n$.

36. A light emitting diode comprising:

a light emitting region capable of emitting radiation; and a reflector reflective of the radiation, the reflector comprising one of gold and gold alloy;

wherein the reflector is separated from the light emitting region by a separation ranging between about $2.12\lambda_n$ and about $2.3\lambda_n$, wherein $\lambda_n$ is the wavelength of the radiation within a region separating the light emitting region from the reflector.

* * * * *

UNITED STATES PATENT AND TRADEMARK OFFICE
CERTIFICATE OF CORRECTION

PATENT NO.    : 6,903,376 B2
DATED         : June 7, 2005
INVENTOR(S)   : Yu-Chen Shen, Michael R. Krames and Michael J. Ludowise It is certified that error appears in the above-identified patent and that said Letters Patent is hereby corrected as shown below:

Column 22,
Line 18, cancel "$0.754\lambda_n$" and substitute -- $0.75\lambda_n$ --.

Signed and Sealed this

Fourth Day of October , 2005

JON W. DUDAS
*Director of the United States Patent and Trademark Office*